(12) United States Patent
Iguchi et al.

(10) Patent No.: US 11,289,634 B2
(45) Date of Patent: Mar. 29, 2022

(54) IMAGE DISPLAY ELEMENT

(71) Applicant: SHARP KABUSHIKI KAISHA, Sakai (JP)

(72) Inventors: Katsuji Iguchi, Sakai (JP); Takashi Kurisu, Sakai (JP); Masumi Maegawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 91 days.

(21) Appl. No.: 16/698,715

(22) Filed: Nov. 27, 2019

(65) Prior Publication Data

US 2020/0176655 A1    Jun. 4, 2020

Related U.S. Application Data

(60) Provisional application No. 62/773,724, filed on Nov. 30, 2018.

(51) Int. Cl.
*H01L 33/62* (2010.01)
*H01L 33/52* (2010.01)
*H01L 25/075* (2006.01)

(52) U.S. Cl.
CPC .......... *H01L 33/62* (2013.01); *H01L 25/0753* (2013.01); *H01L 33/52* (2013.01)

(58) Field of Classification Search
CPC ..... H01L 33/62; H01L 25/0753; H01L 33/52; H01L 33/382; H01L 33/46; H01L 27/156
See application file for complete search history.

(56) References Cited

U.S. PATENT DOCUMENTS

| | | | |
|---|---|---|---|
| 2006/0169997 A1 | 8/2006 | Suzuki et al. | |
| 2006/0273335 A1 | 12/2006 | Asahara et al. | |
| 2009/0267096 A1* | 10/2009 | Kim | H01L 33/382 |
| | | | 257/98 |
| 2016/0276329 A1 | 9/2016 | Bono et al. | |
| 2017/0242549 A1* | 8/2017 | Lim | G06K 9/00013 |
| 2018/0062047 A1* | 3/2018 | Biwa | H01L 33/46 |
| 2018/0358339 A1 | 12/2018 | Iguchi | |

FOREIGN PATENT DOCUMENTS

| | | |
|---|---|---|
| JP | 2002-141492 A | 5/2002 |
| JP | 2006196694 A | 7/2006 |
| JP | 2015177021 A | 10/2015 |
| WO | 2006/006555 A1 | 1/2006 |
| WO | 2017/094461 A1 | 6/2007 |

* cited by examiner

*Primary Examiner* — Su C Kim
(74) *Attorney, Agent, or Firm* — ScienBiziP, P.C.

(57) ABSTRACT

In a micro light emitting element, a first metal film electrically connected to a second conductive layer is disposed on a surface on an opposite side of a light emitting surface side. The first metal film covers the second conductive layer. A first inclined angle of a first conductive layer side surface from a slope formed around a light emission layer to the light emitting surface is larger than a second inclined angle of the slope. The slope and the first conductive layer side surface are covered together by a second metal film. A first transparent insulating film is disposed between the slope and the second metal film.

14 Claims, 24 Drawing Sheets

FIG. 11

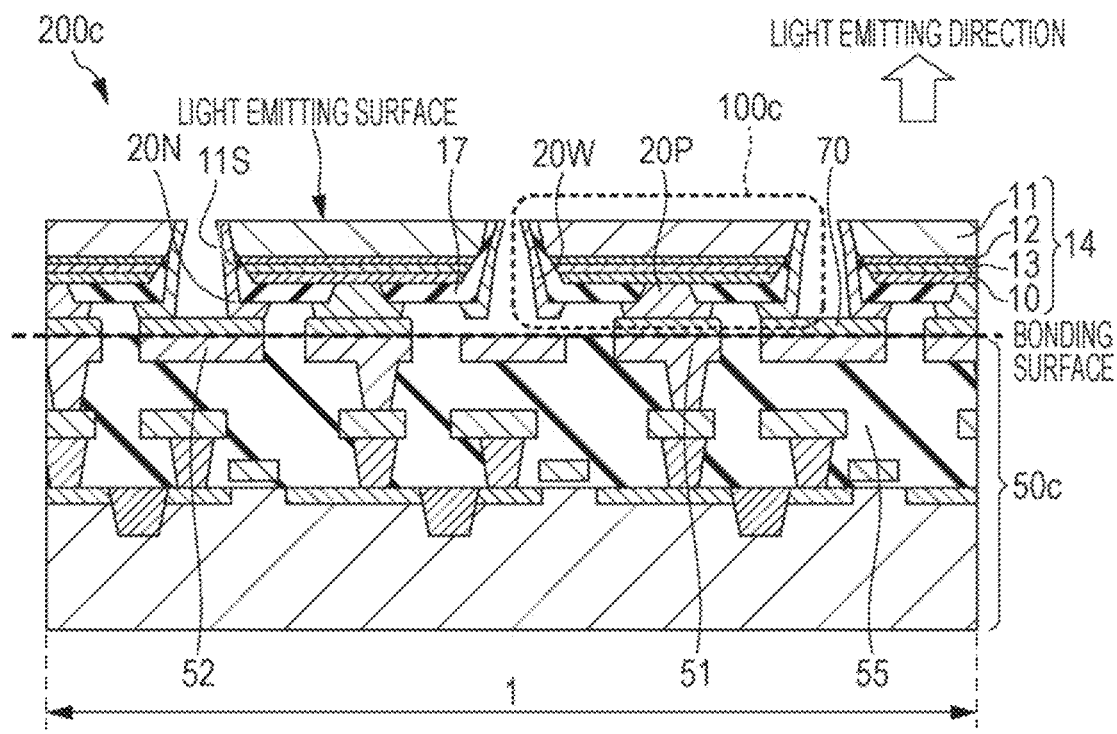

1: PIXEL REGION
3: N CONNECTION REGION
10: P-SIDE METAL LAYER
11: N-SIDE LAYER
11S: N-SIDE LAYER SIDE SURFACE
12: LIGHT EMISSION LAYER
13: P-SIDE LAYER
14: COMPOUND SEMICONDUCTOR
17: TRANSPARENT INSULATING FILM
20N: N-ELECTRODE
20P: P-ELECTRODE
20W: METAL REFLECTIVE LAYER
55: INSULATING FILM
50c: DRIVING CIRCUIT SUBSTRATE
51: P-DRIVE ELECTRODE
52: N-DRIVE ELECTRODE
70: BONDING MATERIAL
100c: MICRO LIGHT-EMITTING ELEMENT
200c: IMAGE DISPLAY ELEMENT

FIG. 13

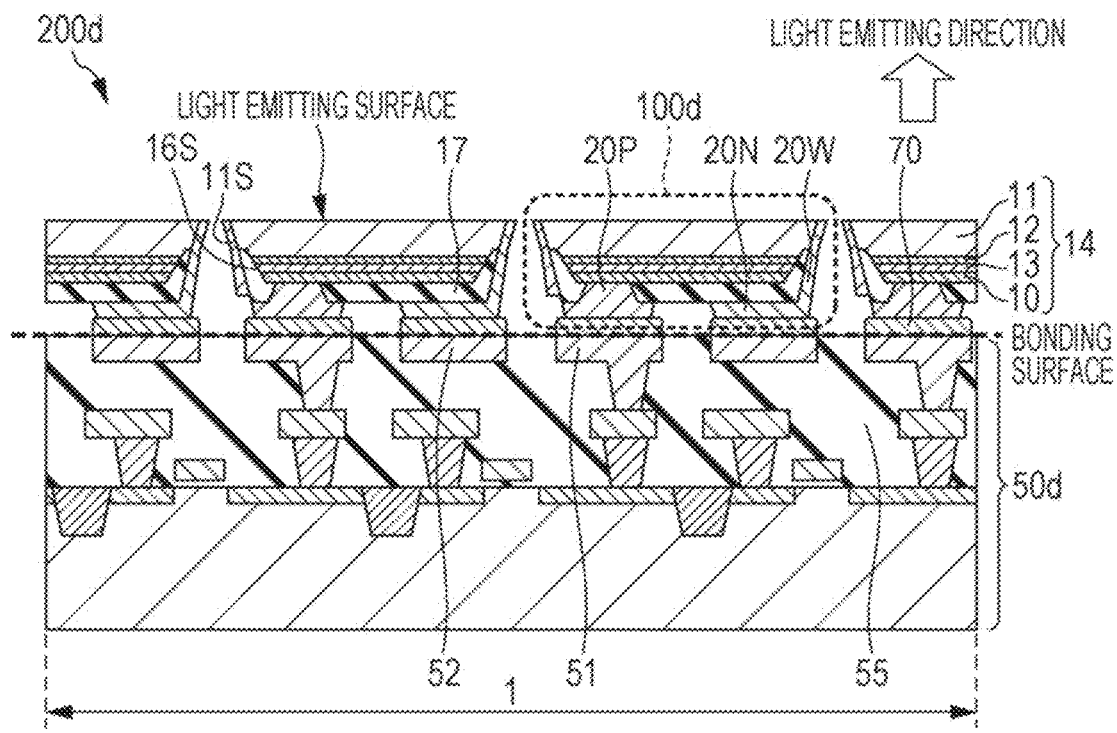

1: PIXEL REGION
10: P-SIDE METAL LAYER
11: N-SIDE LAYER
11S: N-SIDE LAYER SIDE SURFACE
12: LIGHT EMISSION LAYER
13: P-SIDE LAYER
14: COMPOUND SEMICONDUCTOR
16S: SLOPE
17: TRANSPARENT INSULATING FILM
20N: N-ELECTRODE
20P: P-ELECTRODE
20W: METAL REFLECTIVE LAYER
55: INSULATING FILM
50d: DRIVING CIRCUIT SUBSTRATE
51: P-DRIVE ELECTRODE
52: N-DRIVE ELECTRODE
70: BONDING MATERIAL
100d: MICRO LIGHT-EMITTING ELEMENT
200d: IMAGE DISPLAY ELEMENT

FIG. 14
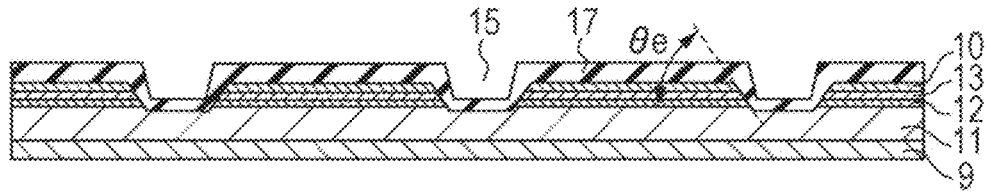
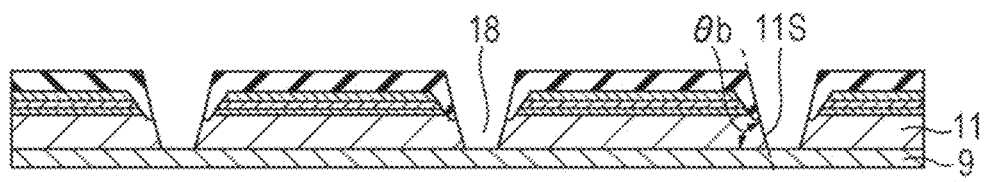
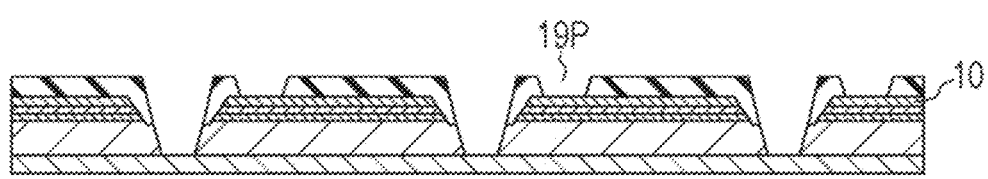
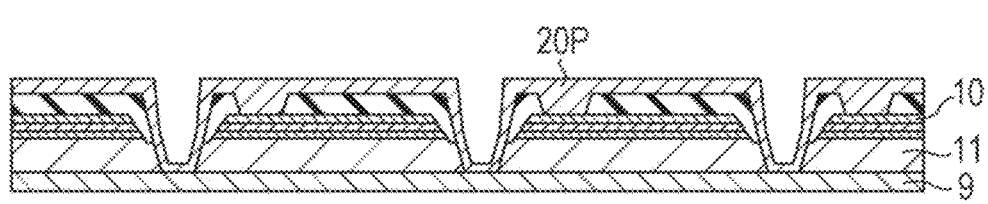
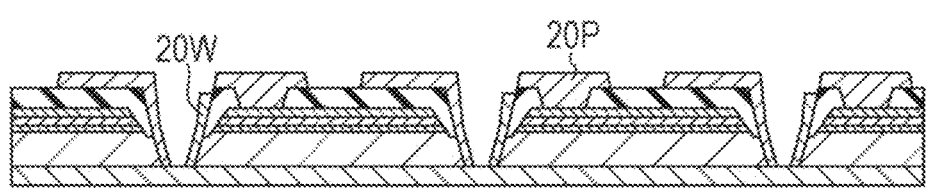
9: GROWTH SUBSTRATE
10: P-SIDE METAL LAYER
11: N-SIDE LAYER
11S: N-SIDE LAYER SIDE SURFACE
12: LIGHT EMISSION LAYER
13: P-SIDE LAYER
14: COMPOUND SEMICONDUCTOR
15: SEPARATION TRENCH
17: TRANSPARENT INSULATING FILM
18: ISOLATION TRENCH
19P: P-CONTACT HOLE
20: METAL LAYER
20P: P-ELECTRODE
20W: METAL REFLECTIVE LAYER
θb, θe: INCLINED ANGLE FIG. 17
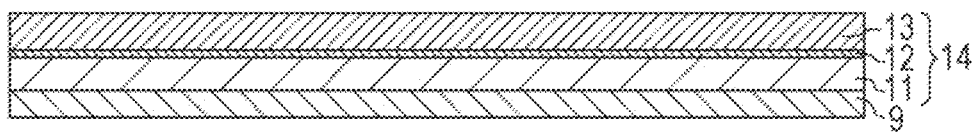
(a)
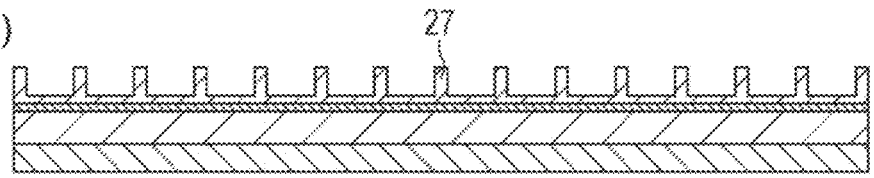
(b)
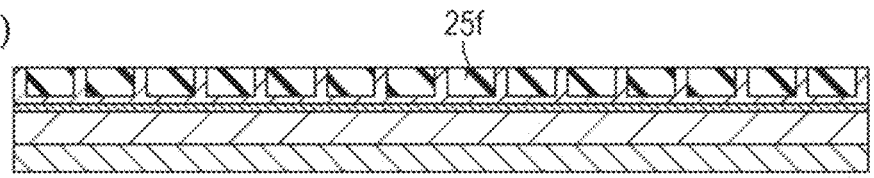
(c)
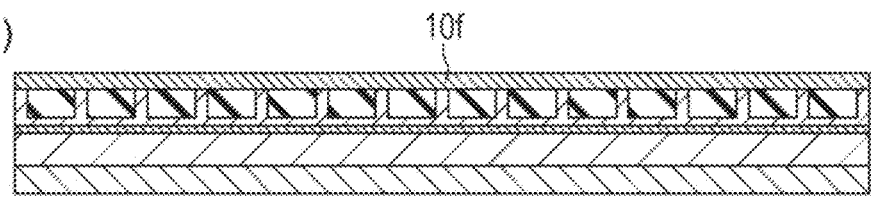
(d)
9: GROWTH SUBSTRATE
10f: P-SIDE METAL LAYER
11: N-SIDE LAYER
12: LIGHT EMISSION LAYER
13: P-SIDE LAYER
14: COMPOUND SEMICONDUCTOR
25f: P-SIDE TRANSPARENT INSULATING FILM
27: P-SIDE LAYER PILLAR FIG. 18
(a)
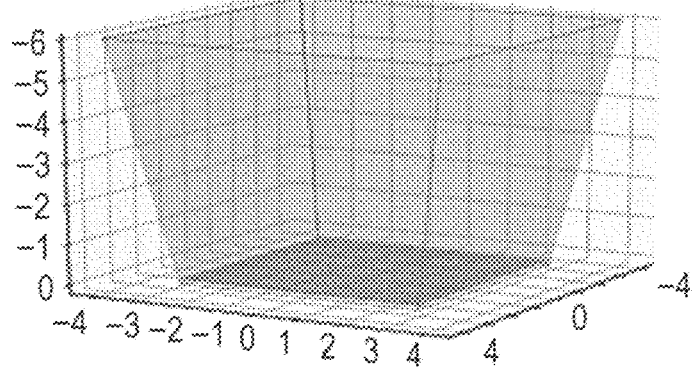
(b)
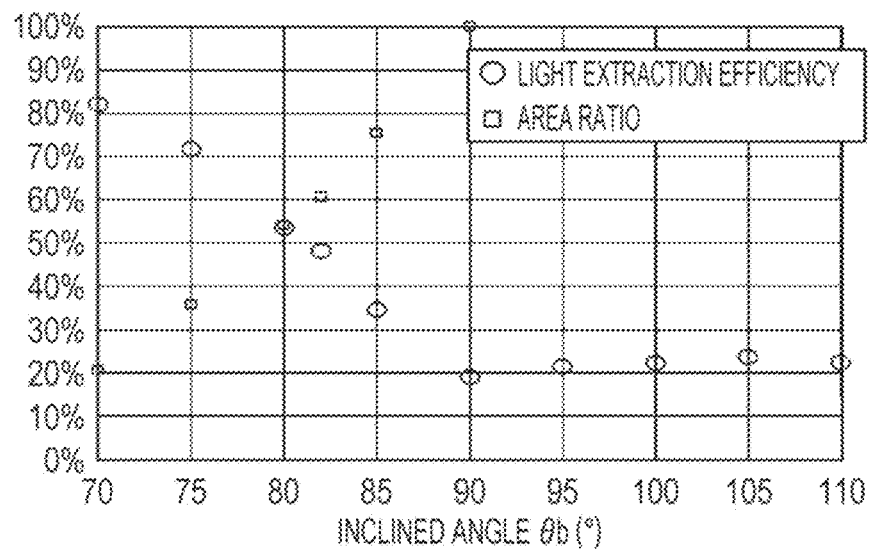
(c)
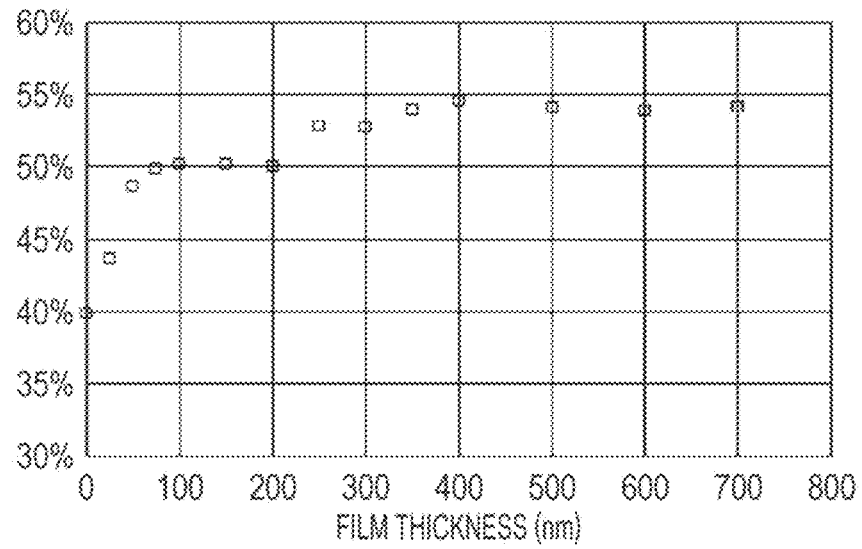

FIG. 19

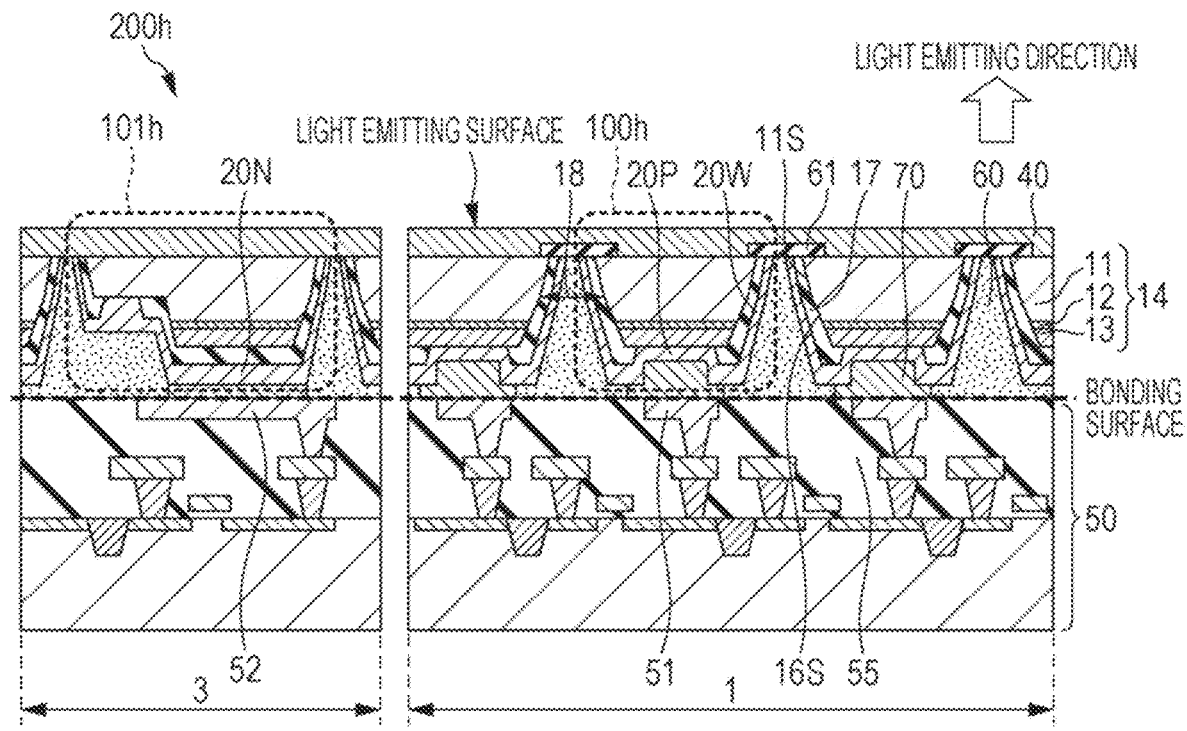

| | |
|---|---|
| 1: PIXEL REGION | 55: INSULATING FILM |
| 3: N CONNECTION REGION | 40: COMMON N-ELECTRODE |
| 11: N-SIDE LAYER | 50: DRIVING CIRCUIT SUBSTRATE |
| 11S: N-SIDE LAYER SIDE SURFACE | 51: P-DRIVE ELECTRODE |
| 12: LIGHT EMISSION LAYER | 52: N-DRIVE ELECTRODE |
| 13: P-SIDE LAYER | 60: FILLING MATERIAL |
| 14: COMPOUND SEMICONDUCTOR | 61: INSULATING LAYER |
| 16S: SLOPE | 70: BONDING MATERIAL |
| 17: TRANSPARENT INSULATING FILM | 100h: MICRO LIGHT-EMITTING ELEMENT |
| 18: ISOLATION TRENCH | 101h: DUMMY CONNECTION ELEMENT |
| 20N: N-ELECTRODE | 200h: IMAGE DISPLAY ELEMENT |
| 20P: P-ELECTRODE | |
| 20W: METAL REFLECTIVE LAYER | |

IMAGE DISPLAY ELEMENT

TECHNICAL FIELD

The present invention relates to an image display element including a micro light emitting element.

BACKGROUND ART

A display element in which a plurality of micro light emitting elements constituting pixels are arranged in a driving circuit substrate has proposed. For example, in a technology disposed in PTL 1, a driving circuit is formed on a silicon substrate, and a minute light emitting diode (LED) array that emits ultraviolet light is disposed on the driving circuit. Alternatively, the technology discloses a small display element in which a wavelength conversion layer that converts ultraviolet light into visible light of red, green, and blue colors is provided on the light emitting diode array, and thus a color image is displayed.

Such a display element has characteristics of high luminance and high durability while being small. For this reason, the display element is expected to be a display element for display devices such as glasses-like devices and head-up displays.

As a manufacturing method of such a display element, a method in which, since the material of the driving circuit substrate is different from the material of the micro light emitting element, the material of the driving circuit substrate and the material of the micro light emitting element are separately formed, and then are stuck to each other is general. Regarding arrangement of an electrode in the micro light emitting element, which has a large influence on the manufacturing method and manufacturing cost, various structures and manufacturing methods thereof are proposed. For example, a case where electrodes in the micro light emitting element are formed on different surfaces, as disclosed in PTLs 1 and 2, a case where the electrodes in the micro light emitting element are formed on the same surface, as disclosed in PTL 3, or the like is exemplified.

CITATION LIST

Patent Literature

[PTL 1] Japanese Unexamined Patent Application Publication No. 2002-141492 (published on May 17, 2002)
[PTL 2] U.S. Patent Application Publication No. 2016/0276329 (published on Sep. 22, 2016)
[PTL 3] International Publication No. WO2017/094461 (published on Jun. 8, 2017)

SUMMARY OF INVENTION

Technical Problem

However, the structure of the micro light emitting element and the display element disclosed in PTLs 1 and 2 described above has problems as follows. Firstly, a large proportion (several tens of percent) of light generated in a light emission layer of the micro light emitting element is emitted from the side surface of the micro light emitting element toward an adjacent micro light emitting element. Such light is absorbed by the adjacent micro light emitting element and is emitted from this micro light emitting element again. Thus, optical crosstalk in which a micro light emitting element other than a micro light emitting element which is originally to emit light appears to emit light.

In a case where micro light emitting elements are joined to each other by a compound semiconductor, light is leaked to the adjacent micro light emitting element through the compound semiconductor, and thus similar optical crosstalk occurs. Such optical crosstalk causes a problem of degradation of contrast and degradation of color purity.

A large quantity of light is lost by light emission from the side surface of the micro light emitting element, and moreover, since light is confined inside the micro light emitting element, a proportion of light to be emitted to the outside to the light generated by the micro light emitting element is decreased, and thus a problem that light emission efficiency is decreased occurs. Such decrease of light extraction efficiency is a phenomenon occurring because the refractive index of the compound semiconductor constituting the micro light emitting element is larger than refractive indices of air and resin. A problem of an increase of power consumption and an increase of a temperature by heat generation occurs by decreasing the light emission efficiency.

An aspect of the present invention has been made considering the above-described problems. An object of the present invention is to prevent the degradation of contrast and the degradation of color purity by preventing the occurrence of optical crosstalk between micro light emitting elements adjacent to each other, and is to reduce power consumption by improving the light emission efficiency of the micro light emitting element.

Solution to Problem

To solve the above problems, (1) according to an embodiment of the present invention, a micro light emitting element includes a compound semiconductor in which a first conductive layer, a light emission layer, and a second conductive layer having a conductivity type opposite to a conductivity type of the first conductive layer are stacked in order from a light emitting surface side. A first metal film electrically connected to the second conductive layer is disposed on a surface on an opposite side of the light emitting surface side. The first metal film covers the second conductive layer. A slope is formed around the light emission layer. A first inclined angle of a first conductive layer side surface from the slope to the light emitting surface is larger than a second inclined angle of the slope. The slope and the first conductive layer side surface are covered together by a second metal film. A first transparent insulating film is disposed between the slope and the second metal film.

(2) According to the embodiment of the present invention, in the micro light emitting element, a second transparent insulating film is disposed between the first conductive layer side surface and the second metal film, in addition to the configuration of (1).

(3) According to the embodiment of the present invention, in the micro light emitting element, the second transparent insulating film is obtained by the first transparent insulating film extending between the first conductive layer side surface and the second metal film, in addition to the configuration of (2).

(4) According to another embodiment of the present invention, a micro light emitting element includes a compound semiconductor in which a first conductive layer, a light emission layer, and a second conductive layer having a conductivity type opposite to a conductivity type of the first conductive layer are stacked in order from a light emitting surface side. A first metal film electrically connected to the second conductive layer is disposed on a surface on an opposite side of the light emitting surface side. The first metal film covers the second conductive layer. A slope is formed around the light emission layer. The slope extends to the light emitting surface and is covered by a second metal film. A first transparent insulating film is disposed between the slope and the second metal film.

(5) According to the embodiment of the present invention, in the micro light emitting element, a third transparent insulating film is disposed between the second conductive layer and the first metal film, in addition to the configuration of any of (1) to (4).

(6) According to the embodiment of the present invention, in the micro light emitting element, in plan view from an opposite side of the light emitting surface side, the second metal film is disposed to overlap the first metal film, in addition to the configuration of any of (1) to (5).

(7) According to the embodiment of the present invention, in the micro light emitting element, a film thickness of the first transparent insulating film is equal to or more than 75 nm, in addition to the configuration of any of (1) to (6).

(8) According to the embodiment of the present invention, in the micro light emitting element, the film thickness of the first transparent insulating film is equal to or more than 400 nm, in addition to the configuration of any of (1) to (7).

(9) According to the embodiment of the present invention, in the micro light emitting element, the second inclined angle is equal to or less than 60°, in addition to the configuration of any of (1) to (3).

(10) According to the embodiment of the present invention, in the micro light emitting element, the second inclined angle is equal to or less than 50°, in addition to the configuration of any of (1) to (3).

(11) According to the embodiment of the present invention, in the micro light emitting element, the first metal film includes a layer containing silver or aluminum as a main component, on the compound semiconductor side, in addition to the configuration of any of (1) to (10).

(12) According to the embodiment of the present invention, in the micro light emitting element, the second metal film includes a layer containing silver or aluminum as a main component, on the compound semiconductor side, in addition to the configuration of any of (1) to (11).

(13) According to the embodiment of the present invention, in the micro light emitting element, the first transparent insulating film is an $SiO_2$ film, in addition to the configuration of any of (1) to (12).

(14) According to the embodiment of the present invention, in the micro light emitting element, the first inclined angle is less than 900, in addition to the configuration of any of (1) to (3).

(15) According to the embodiment of the present invention, in the micro light emitting element, the second metal film is electrically connected to the first conductive layer, in addition to the configuration of any of (1) to (14).

(16) According to the embodiment of the present invention, the micro light emitting element further includes a second electrode electrically connected to the second metal film, on an opposite side of the light emitting surface side, in addition to the configuration of (15).

(17) According to the embodiment of the present invention, the micro light emitting element further includes a light emitting surface-side electrode configured from a transparent conductive film electrically connected to the first conductive layer, on a surface of the first conductive layer on the light emitting surface side, in addition to the configuration of any of (1) to (14).

(18) According to the embodiment of the present invention, an image display element has a pixel region in which micro light emitting elements are arranged on a driving circuit substrate in a two-dimensional array shape, in addition to the configuration of any of (1) to (17). A surface of the micro light emitting element on an opposite side of the light emitting surface side faces a surface of the driving circuit substrate. First driving electrodes for supplying a current to the micro light emitting elements are arranged in a two-dimensional array shape on a surface of the driving circuit substrate in the pixel region. A first electrode and the first driving electrode are connected in a one-to-one relation.

(19) According to the embodiment of the present invention, an image display element has a pixel region in which micro light emitting elements are arranged on a driving circuit substrate in a two-dimensional array shape, in addition to the configuration of (17). A surface of the micro light emitting element on an opposite side of the light emitting surface side faces a surface of the driving circuit substrate. First driving electrodes for supplying a current to the micro light emitting elements are arranged in a two-dimensional array shape on a surface of the driving circuit substrate in the pixel region. A first electrode and the first driving electrode are connected in a one-to-one relation. A second driving electrode is disposed on a surface of the driving circuit substrate on an outside of the pixel region. The second driving electrode is electrically connected to the light emitting surface-side electrode.

(20) According to the embodiment of the present invention, an image display element has a pixel region in which micro light emitting elements are arranged on a driving circuit substrate in a two-dimensional array shape, in addition to the configuration of (16). A surface of the micro light emitting element on an opposite side of the light emitting surface side faces a surface of the driving circuit substrate. First driving electrodes and second driving electrodes for supplying a current to the micro light emitting elements are arranged in a two-dimensional array shape on a surface of the driving circuit substrate in the pixel region. A first electrode and the first driving electrode are connected in a one-to-one relation. The second electrode and the second driving electrode are connected to each other.

Advantageous Effects of Invention

It is possible to prevent the degradation of contrast and the degradation of color purity by preventing the occurrence of optical crosstalk between micro light emitting elements adjacent to each other, and to reduce power consumption by improving the light emission efficiency of the micro light emitting element.

BRIEF DESCRIPTION OF DRAWINGS

FIG. 11 is a schematic sectional view of an image display element according to Embodiment 4 of the present invention.

FIG. 13 is a schematic sectional view of an image display element according to Embodiment 5 of the present invention.

FIGS. 14(a) to 14(e) are schematic sectional views illustrating a manufacturing flow of the image display element according to Embodiment 5 of the present invention.

FIGS. 17(a) to 17(d) are schematic sectional views illustrating a manufacturing flow of an image display element according to Embodiment 7 of the present invention.

FIG. 18(a) is an aerial view of a micro light emitting element having a truncated pyramid type structure according to Embodiment 8 of the present invention, FIG. 18(b) is a diagram illustrating a simulation result of dependency of the light extraction efficiency on an inclined angle, and FIG. 18(c) is a diagram illustrating a simulation result of the film thickness dependency of a transparent insulating film in the light extraction efficiency.

FIG. 19 is a schematic sectional view of an image display element according to Embodiment 9 of the present invention.

DESCRIPTION OF EMBODIMENTS

Embodiment 1

(Configuration of Image Display Element 200)

Figure 1:
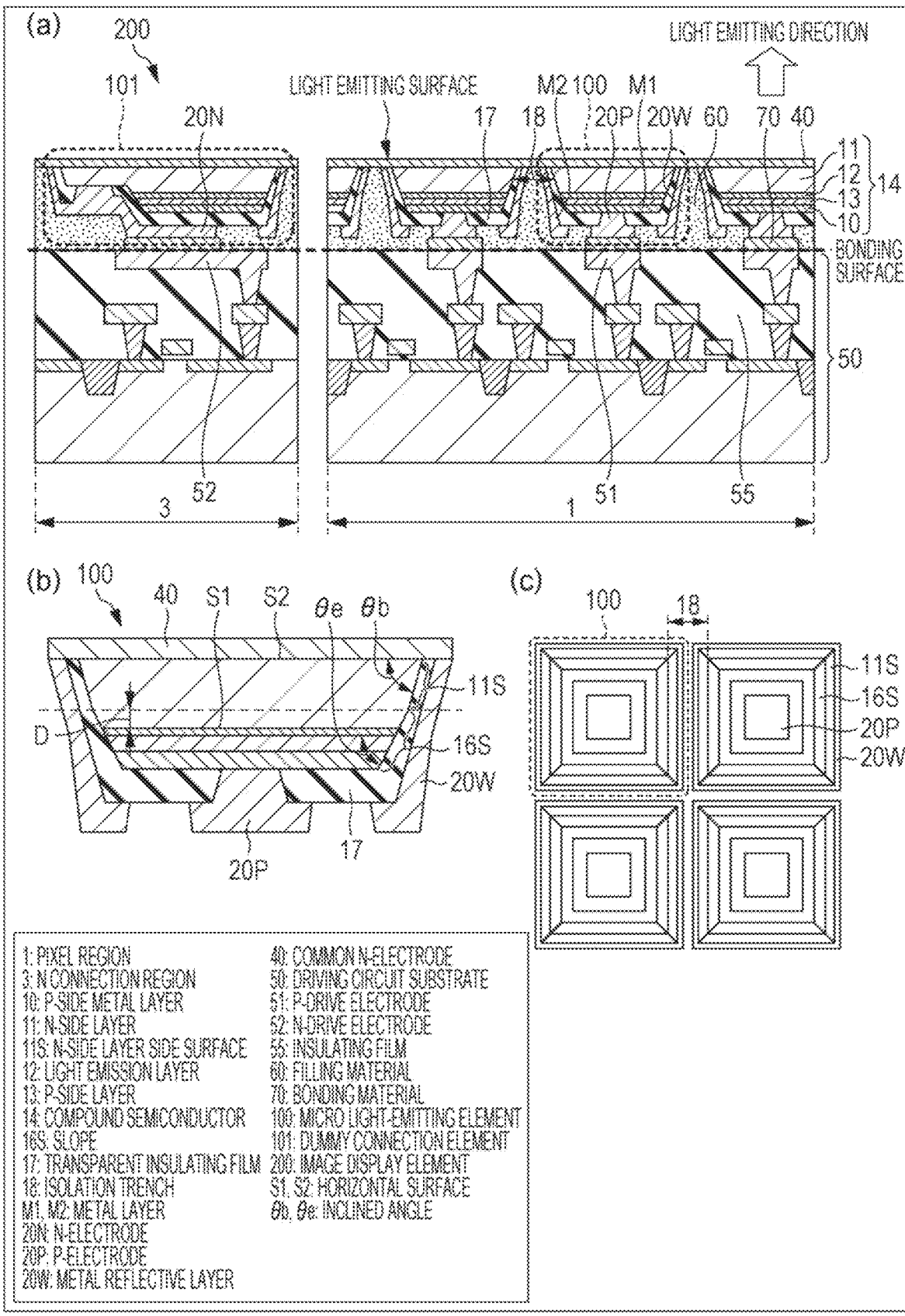
FIG. 1(a) is a schematic sectional view of an image display element according to Embodiment 1 of the present invention.
FIG. 1(b) is a schematic sectional view of a micro light emitting element according to Embodiment 1 of the present invention.
FIG. 1(c) is a schematic plan view of the micro light emitting element according to Embodiment 1 of the present invention.

FIG. 1(a) is a schematic sectional view of an image display element 200 according to Embodiment 1 of the present invention. FIG. 1(b) is a schematic sectional view of a micro light emitting element 100 according to Embodiment 1 of the present invention. FIG. 1(c) is a schematic plan view of the micro light emitting element 100 according to Embodiment 1 of the present invention. The image display element 200 including a plurality of micro light emitting elements 100 will be described below, as an example, with reference to FIGS. 1 to 6. In descriptions of the configuration of the image display element 200, a light emitting surface is referred to as an upper surface, a surface on an opposite side of the light emitting surface side is referred to as a lower surface, and surfaces on sides other than the upper surface and the lower surface are referred to as side surfaces.

As illustrated in FIG. 1(a), the image display element 200 includes the plurality of micro light emitting elements 100 and a driving circuit substrate 50. The driving circuit substrate 50 supplies a current to the micro light emitting element 100 in a pixel region 1 to control light emission. The pixel region 1 is a region in which the micro light emitting elements 100 are arranged on the driving circuit substrate 50 in a two-dimensional array shape. The image display element 200 has the pixel region 1.

The micro light emitting element 100 emits light to the opposite side of the driving circuit substrate 50. A wavelength conversion layer, a light diffusion layer, a color filter, a micro-lens, and the like may be arranged on the light emitting surface side in the micro light emitting element 100. These components are not directly related to one form of the present invention, and thus are not illustrated in the drawings.

The driving circuit substrate 50 is configured by a micro light emitting element driving circuit, a row selection circuit, a column signal output circuit, an image processing circuit, an input and output circuit, and the like. The micro light emitting element driving circuit controls a current to be supplied to each micro light emitting element 100. The row selection circuit selects each row of the micro light emitting elements 100 arranged in a two-dimensional matrix shape. The column signal output circuit outputs a light emitting signal to each column. The image processing circuit calculates the light emitting signal based on an input signal.

A P-drive electrode (first driving electrode) 51 connected to the micro light emitting element 100 and an N-drive electrode (second driving electrode) 52 are disposed on a surface of the driving circuit substrate 50 on a bonding surface side. That is, the surface of the driving circuit substrate 50 faces a surface of the micro light emitting element 100 on an opposite side of the light emitting surface side. In FIG. 1, the driving circuit substrate 50 is a silicon substrate (semiconductor substrate) in which an LSI is formed, but other form of the driving circuit substrate such as glass substrate with TFT circuit is also possible. Since the driving circuit substrate can be manufactured by a well-known technology, detailed descriptions of the function and the configuration thereof will not be made.

P-drive electrodes 51 for supplying a current to the micro light emitting elements 100 are arranged on the surface of the pixel region 1 in the driving circuit substrate 50 in a two-dimensional array shape. Alternatively, the N-drive electrode 52 is disposed on the surface (surface of an N connection region 3) of the driving circuit substrate 50 on the outside of the pixel region 1. The N-drive electrode 52 is electrically connected to a common N-electrode (light emitting surface-side electrode) 40 through a metal reflective layer 20W.

Various planar shapes such as a rectangle, a polygon, a circle, and an ellipse may be provided as the shape of the micro light emitting element 100. The longest length of the micro light emitting element 100 in a longitudinal direction of the upper surface is equal to or less than 60 μm. Regarding the image display element 200, 3000 or more micro light emitting elements 100 are integrated in the pixel region 1.

The micro light emitting element 100 includes a compound semiconductor 14. Generally, the compound semiconductor 14 is configured in a manner that an N-side layer (first conductive layer) 11, a light emission layer 12, and a P-side layer (second conductive layer) 13 are stacked in order from the light emitting surface side. The P-side layer 13 has a conductivity type opposite to the conductivity type of the N-side layer 11.

For example, in a case where the micro light emitting element 100 emits light in a wavelength band from ultraviolet light to a green color, the compound semiconductor 14 is a semiconductor of a nitride semiconductor (AlInGaN series). In a case where the micro light emitting element 100 emits light in a wavelength band from a yellow color to a red color, the compound semiconductor 14 is an AlInGaP-based semiconductor. Alternatively, in a case where the micro light emitting element 100 emits light in a wavelength band from the red color to infrared light, the compound semiconductor 14 is an AlGaAs-based or GaAs-based semiconductor. Depending on wavelength, other material such as quantum dot of CdSe or InP and Perovskite nanocrystal can be used as the compound semiconductor 14.

The configuration of the compound semiconductor 14, in which the N-side layer 11 is disposed on the light emitting surface side will be described below. However, a configuration in which the P-side layer 13 is disposed on the light emitting surface side may be made. Normally, each of the N-side layer 11, the light emission layer 12, and the P-side layer 13 is optimized by including a plurality of layers instead of a single layer. However, this is not directly related to the form of the present invention, and thus detailed descriptions of the detailed structure of each of the N-side layer 11, the light emission layer 12, and the P-side layer 13 are not made.

Normally, the light emission layer 12 is interposed between an N-type layer and a P-type layer. However, a case where the N-type layer and the P-type layer include a non-doped layer or a layer having dopants of opposite conductivity may be provided. For this reason, the N-type layer and the P-type layer will be described below as an N-side layer and a P-side layer, respectively.

The surface of the driving circuit substrate 50 is a bonding surface bonded to the plurality of micro light emitting elements 100, and the plurality of micro light emitting elements 100 are stuck to the surface. In the embodiment, the micro light emitting element 100 is a so-called vertical type. The micro light emitting element 100 includes a P-electrode (first electrode) 20P on the lower surface and includes a common N-electrode 40 on the upper surface.

Specifically, in the micro light emitting element 100, the common N-electrode 40 is disposed on the light emitting surface side, and the P-electrode 20P is disposed on the surface on an opposite side of the light emitting surface side. The light emitting surface of the micro light emitting element 100 is the upper surface of the micro light emitting element 100. The side opposite to the light emitting surface is a lower side of the micro light emitting element 100, on which the P-electrode 20P is disposed. The P-electrode 20P and the P-drive electrode 51 are connected in a one-to-one relation.

In the pixel region 1, the P-electrode 20P connected to the P-side layer 13 is disposed on the lower surface of the micro light emitting element 100. The P-electrode 20P is connected to the P-drive electrode 51 on the driving circuit substrate 50 through a bonding material 70, and thus transmits a current supplied from the driving circuit substrate 50 to the P-side layer 13.

The current passing through the P-side layer 13 further passes through the light emission layer 12 and the N-side layer 11 to flow to the common N-electrode 40. The current flows to the N-drive electrode 52 of the driving circuit substrate 50 in the N connection region 3 on the outside of the pixel region 1. In this manner, the micro light emitting element 100 emits light at predetermined intensity, in accordance with the current amount supplied by the driving circuit substrate 50.

Alternatively, in FIG. 1, in order to connect the common N-electrode 40 and the N-drive electrode 52 by the same structure as the structure of connecting the P-electrode 20P and the P-drive electrode 51, a dummy connection element 101 configured with the same material as the material of the micro light emitting element 100 is used. With such a configuration, it is possible to simplify a connection process between the micro light emitting element 100 and the driving circuit substrate 50. A connection method between the common N-electrode 40 and the N-drive electrode 52 may be different from a connection method between the P-electrode 20P and the P-drive electrode 51. Alternatively, the dummy connection element 101 may be processed to be a rod extending in a depth direction of the paper surface in FIG. 1(a) or 1(b).

The lower surface of the P-side layer 13 is in contact with a P-side metal layer (first metal film) 10. The P-side metal layer 10 has a need to reflect light reaching the lower surface of the P-side layer 13 upward with high efficiency, and thus preferably covers most of the lower surface of the P-side layer 13. The P-side metal layer 10 prevents downward emission of light. The P-side metal layer 10 is disposed on a surface on the opposite side of the light emitting surface side and is electrically connected to the P-electrode 20P and the P-side layer 13. The P-side metal layer 10 covers the P-side layer 13 from the surface on the opposite side of the light emitting surface side.

The P-side metal layer 10 may be configured by a single layer or a plurality of layers. Preferably, a metal layer having high reflectivity for visible light is disposed on a side of the P-side metal layer 10, which is in contact with the P-side layer 13. For example, the P-side metal layer 10 includes a metal layer M1 containing silver or aluminum as the main component, on the P-side layer 13 side. In order to realize a favorable ohmic contact between the metal layer M1 and the P-side layer 13, metal such as palladium or nickel may be partially arranged, or a very thin metal film of palladium, nickel, or the like may be disposed.

The common N-electrode 40 is formed from a transparent conductive layer, that is, a transparent conductive film electrically connected to the N-side layer 11. The common N-electrode 40 may be an oxide semiconductor such as indium tin oxide (ITO) and indium zinc oxide (IZO) or may be a silver nanofiber layer.

Alternatively, the common N-electrode 40 may be a mesh-like metal thin film disposed at the upper portion of a filling material 60. The micro light emitting element 100 includes the common N-electrode 40 on the surface of the N-side layer 11 on the light emitting surface side. An isolation trench 18 formed between the plurality of micro light emitting elements 100 is filled with the filling material 60.

The micro light emitting elements 100 are separately divided by the isolation trench 18. For this reason, it is possible to prevent light leakage between the micro light emitting elements 100 adjacent to each other. The entire periphery of the side surface of the light emission layer 12 constitutes a portion of a slope 16S. That is, the slope 16S is formed around the light emission layer 12. The slope 16S constitutes a portion of the side surface of the N-side layer 11, the entire periphery of the side surface of the light emission layer 12, and the entire periphery of a portion of the side surface of the P-side layer 13. As illustrated in FIG. 1(c), in a case where a planar shape of the micro light emitting element 100 is rectangular, a portion of the periphery of the side surface of one micro light emitting element 100 constitutes four slopes 16S. Preferably, all the side surfaces of the P-side layer 13 are inclined similar to the light emission layer 12. However, the lower surface of the P-side layer 13 may be bent from the slop 16S depending on a manufacturing flow.

In the embodiment, a case where the planar shape of the micro light emitting element 100 is rectangular will be described. However, in a case where the planar shape of the micro light emitting element 100 is polygonal, a plurality of slopes 16S are formed. Specifically, in a case where N corners (N is a natural number) of a polygon being the planar shape of the micro light emitting element 100 are provided, N pieces of slopes 16S are formed.

Alternatively, in a case where the planar shape of the micro light emitting element 100 is circular, the slope 16S is formed by a truncated conical side surface. An inclined angle (second inclined angle) θe of the slope 16S is approximately 40° to 55°, and preferably 35° to 60° in consideration of manufacturing variations. The inclined angle θe is an angle formed by the slope 16S and a horizontal surface (upper surface) S1 of the light emission layer 12.

As illustrated in FIG. 1(b), the slope 16S extends from the side surface of the P-side layer 13 to a portion of the side surface of the N-side layer 11. However, the slope 16S does not reach the light emitting surface, that is, the upper surface of the micro light emitting element 100. The portion of the side surface of the N-side layer 11 constitutes an N-side layer side surface (first conductive layer side surface) 11S. The N-side layer side surface 11S extends from the slope 16S to the light emitting surface.

The inclined angle (first inclined angle) θb of the N-side layer side surface 11S is an angle larger than the inclined angle θe. The inclined angle θb is less than 90°, and preferably small.

In a case where the horizontal surface S1 of the light emission layer 12 is parallel to the horizontal surface (upper surface) S2 of the N-side layer 11, the inclined angle θb is an angle formed by the N-side layer side surface 11S and the horizontal surface S2 of the N-side layer 11. In a case where the horizontal surface S1 of the light emission layer 12 is not parallel to the horizontal surface S2 of the N-side layer 11, the inclined angle θb is an angle formed by the N-side layer side surface 11S and the horizontal surface S2 of the N-side layer 11.

However, in a case where the size of the micro light emitting element 100 is small (for example, in a case where the long side of the upper surface of the micro light emitting element 100 is equal to or less than 10 µm), if the inclined angle θb is reduced, the area of the horizontal surface of the light emission layer 12 is reduced. If the area of the horizontal surface of the light emission layer 12 is reduced, current density of a current passing through the light emission layer 12 may increase, and thus internal quantum efficiency may decrease. Thus, the inclined angle θb is preferably about 700 to 850.

The slope 16S and the N-side layer side surface 11S are covered by a transparent insulating film (first transparent insulating film) 17. The transparent insulating film 17 is covered by a metal reflective layer (second metal film) 20W. That is, the slope 16S and the N-side layer side surface 11S are covered together by the metal reflective layer 20W. The transparent insulating film 17 is transparent to visible light as with $SiO_2$, and a material having a refractive index which is less than the refractive index of the compound semiconductor 14 is preferable.

The transparent insulating film 17 is disposed between the slope 16S and the metal reflective layer 20W. The transparent insulating film 17 extends between the N-side layer side surface 11S and the metal reflective layer 20W. Here, a portion of the transparent insulating film 17, which is disposed between the slope 16S and the metal reflective layer 20W is referred to as a first transparent insulating film. A portion thereof, which is disposed between the N-side layer side surface 11S and the metal reflective layer 20W is referred to as a second transparent insulating film. In this case, the second transparent insulating film is set to be obtained by the first transparent insulating film extending between the N-side layer side surface 11S and the metal reflective layer 20W. That is, the first transparent insulating film and the second transparent insulating film are integrally formed. The film thickness of the transparent insulating film 17 is preferably equal to or more than 75 nm, and more preferably equal to or more than 400 nm, in particular.

The metal reflective layer 20W may be configured by a single layer or a plurality of layers. Preferably, the metal reflective layer 20W includes a metal layer M2 on the transparent insulating film 17 side, that is, on the compound semiconductor 14 side. The metal layer M2 contains silver or aluminum having high reflectivity for visible light, as the main component. The metal reflective layer 20W has a need to shield light, and thus the entire thickness thereof is preferably several tens or more of nm. The same material is used for the P-electrode 20P and the metal reflective layer 20W in order to simplify a manufacturing flow. However, different materials may be used.

In plan view from a side opposite to the light emitting surface side, the metal reflective layer 20W is preferably disposed to overlap the P-side metal layer 10. In plan view from a side opposite to the light emitting surface, if a space is provided between the metal reflective layer 20W and the P-side metal layer 10, light is emitted from the space to the outside, and this causes optical crosstalk. Thus, preferably, there is no space. The filling material 60 may be a transparent material.

Since a situation in which light is emitted from the micro light emitting element 100 in a bottom surface direction and a side surface direction does not occur by the metal reflective layer 20W and the P-side metal layer 10, it is possible to prevent the occurrence of optical crosstalk even though the filling material 60 is transparent resin. In a micro light emitting element in the related art, the occurrence of optical crosstalk is prevented by the filling material, but it is difficult to completely prevent the occurrence of optical crosstalk by bubbles appeared in the filling material.

Alternatively, in the micro light emitting element in the related art, it is necessary to use a special material such as a light absorbing material like carbon black or a white resin containing $TiO_2$ particles, as the filling material. Thus, it is necessary to increase a filling time for preventing generation of bubbles in the filling material. For this reason, the filling material is expensive, and thus manufacturing cost increases.

However, in the form of the present invention, it is easy to perform material selection of the filling material 60 and to product the filling material 60. Thus, it is possible to decrease manufacturing cost in comparison to a case of manufacturing the micro light emitting element in the related art.

(Manufacturing Flow of Micro Light Emitting Element 100)

Next, the manufacturing flow of the micro light emitting element 100 will be described with reference to FIGS. 2(a) to 2(g). FIGS. 2(a) to 2(g) are schematic sectional views illustrating the manufacturing flow of the micro light emitting element 100 according to Embodiment 1 of the present invention. In descriptions of the manufacturing flow of the micro light emitting element 100, the P-side metal layer 10 side is set to be upper, and a growth substrate 9 side is set to be lower.

A sectional view of the pixel region 1 is illustrated on the right side in FIGS. 2(a) to 2(g), and a sectional view of the N connection region 3 is illustrated on the left side in FIGS. 2(a) to 2(g). As illustrated in FIG. 2(a), the compound semiconductor 14 is formed by sequentially stacking the N-side layer 11, the light emission layer 12, and the P-side layer 13 on the growth substrate 9. The P-side metal layer 10 is further deposited on the compound semiconductor 14.

After the P-side metal layer 10 is deposited on the compound semiconductor 14, as illustrated in FIG. 2(b), a separation trench 15 is formed by etching portions of the P-side metal layer 10, the P-side layer 13, the light emission layer 12, and the N-side layer 11. At this time, a portion including the light emission layer 12 serves as a mesa 16. The mesa 16 is configured by the N-side layer 11, the light emission layer 12, the P-side layer 13, and the P-side metal layer 10. As illustrated in FIG. 1(c), when viewed from the upper surface, the separation trench 15 is formed at equal intervals in an up-down and a right-left direction. The shape of the mesa 16 is a shape of a truncated pyramid.

The shape of the mesa 16 is not limited to a truncated pyramid and may be a truncated cone or another truncated polygon. In the pixel region 1, the separation trench 15 separates the micro light emitting elements 100 from each other. And, in the N connection region 3, an N-contact trench 15N is formed simultaneously with the separation. An N-contact hole 19N is formed later in the N-contact trench 15N.

The slope 16S as the side surface of the mesa 16 is formed and processed such that the inclined angle θe as the angle formed by the slope 16S and the horizontal surface of the light emission layer 12 is, for example, 500. Preferably, the slope 16S is formed such that the inclined angle θe is 40° to 55°. The slope 16S reflects light traveling in a direction parallel to the horizontal surface of the light emission layer 12, which occupies a large part of light emitted from the light emission layer 12, toward the light emitting surface. Thus, it is possible to increase light extraction efficiency of the micro light emitting element 100.

In a case where the slope 16S is perpendicular to the horizontal surface of the light emission layer 12, light emitted in the direction parallel to the horizontal surface of the light emission layer 12 repeats reflection, and thereby is not emitted to the outside. If the inclined angle θe deviates from 450 largely, an incident angle of light, which is emitted from the light emission layer 12 and is incident to the light emitting surface, becomes too large, when the light is emitted from the light emission layer 12 and reflected by the slope 16S. Thus, total reflection occurs on the light emitting surface, and the light is not emitted to the outside. The inclined angle θe may be different for each of the plurality of side surfaces of the mesa 16. In this case, a plurality of inclined angles θe is provided. The minimum angle of the plurality of inclined angles θe is preferably 400 to 550, and further preferably, all the inclined angles θe are 40° to 55°.

After the separation trench 15 is formed, as illustrated in FIG. 2(c), an isolation trench 18 that divides the compound semiconductor 14 of the micro light emitting element 100 is formed. The side surface of the N-side layer 11, which is formed by the isolation trench 18 is the N-side layer side surface 11S. The N-side layer side surface is processed and formed such that the inclined angle θb as an angle formed by the N-side layer side surface 11S and the horizontal surface of the growth substrate 9 is, for example, 80°. Preferably, the N-side layer side surface 11S is formed such that the inclined angle θb is 700 to 850. That is, the inclined angle θb is preferably larger than the inclined angle θe.

In order to improve light extraction efficiency of the micro light emitting element 100, preferably, the inclined angle θb is as small as possible in an angle range of being larger than the inclined angle θe. In the subsequent process, the growth substrate 9 is separated, and thus an interface between the N-side layer 11 and the growth substrate 9 or the processed surface of the N-side layer 11 serves as the light emitting surface. Thus, the inclined angle θb is equal to an angle formed by the N-side layer side surface 11S and the light emitting surface.

In FIG. 2(c), the isolation trench 18 reaches the growth substrate 9, but the N-side layer 11 having a predetermined thickness may remain. That is, the isolation trench 18 may not reach the growth substrate 9. In FIG. 3(c) as the subsequent process, after the growth substrate 9 is separated, the remaining N-side layer 11 is removed by etching, polishing, and the like. Thus, as illustrated in FIG. 1(a), it is possible to individually separate the micro light emitting elements 100 from each other.

The shape of the micro light emitting element 100 is important in a state where the image display element 200 is formed. Temporary shape of the micro light emitting element in the middle of the manufacturing flow is not important. The inclined angle θb of the N-side layer side surface 11S may be different for each of a plurality of side surfaces of the N-side layer 11. In this case, a plurality of inclined angles θb is provided. The minimum angle of the plurality of inclined angles θb is preferably 700 to 850, and further preferably, all the inclined angle θb are 700 to 850.

Figure 2:
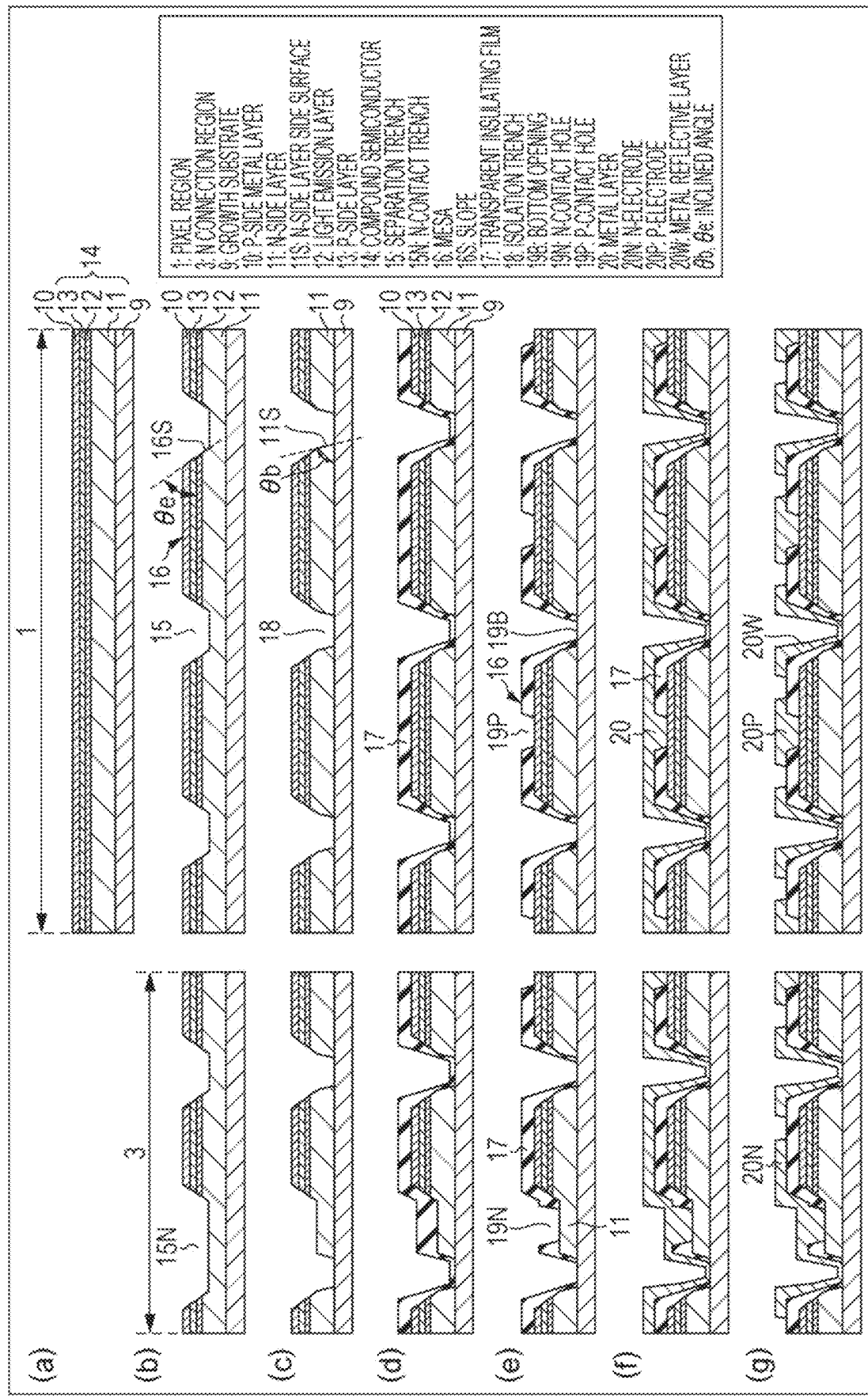
FIGS. 2(a) to (g) are schematic sectional views illustrating a manufacturing flow of the micro light emitting element according to Embodiment 1 of the present invention.

After the isolation trench 18 is formed, as illustrated in FIG. 2(*d*), the transparent insulating film 17 is deposited to cover the exposed portions of the growth substrate 9, the N-side layer 11, the light emission layer 12, the P-side layer 13, and the P-side metal layer 10. Here, a $SiO_2$ film having a thickness of 400 nm is deposited as the transparent insulating film 17 by a CVD method. Films of SiN, SiON, and SiCO or a film obtained by stacking the above films may be provided as the transparent insulating film 17 in place of the $SiO_2$ film. Preferably, the transparent insulating film 17 is formed by the CVD method such that the thickness of the transparent insulating film 17 that covers the side surface of the micro light emitting element 100 is uniform.

After the transparent insulating film 17 is deposed, as illustrated in FIG. 2(*e*), a P-contact hole 19P is formed in the mesa 16 of the pixel region 1, and an N-contact hole 19N is formed in the N-contact trench 15N of the N connection region 3. Specifically, the N-contact hole 19N is formed by removing the transparent insulating film 17 on the N-side layer 11 in the N-contact trench 15N. At this time, a bottom opening 19B may be formed in the transparent insulating film 17 deposited on the bottom of the isolation trench 18. The P-contact hole 19P reaches the P-side metal layer 10, and the N-contact hole 19N reaches the N-side layer 11 of the N-contact trench 15N.

Further, as illustrated in FIG. 2(*f*), the metal layer 20 is deposited on the transparent insulating film 17. Then, as illustrated in FIG. 2(*g*), the metal layer 20 is patterned. Thus, the metal layer 20 is processed to serve as the P-electrode 20P on the P-contact hole 19P, to serve as the metal reflective layer 20W in the periphery of the isolation trench 18, and to serve as the N-electrode (second electrode) 20N in the N connection region 3.

As described above, the micro light emitting element 100 is formed by a very simple manufacturing flow in which a process of depositing the transparent insulating film 17 is performed once, a process of forming the metal layer 20 is performed twice, and a photolithographic process is performed four times. Further, the dummy connection element 101 is formed in the N connection region 3, and thus a connection with the driving circuit substrate 50 becomes simple as described later.

(Manufacturing Flow of Image Display Element 200)

Figure 3:
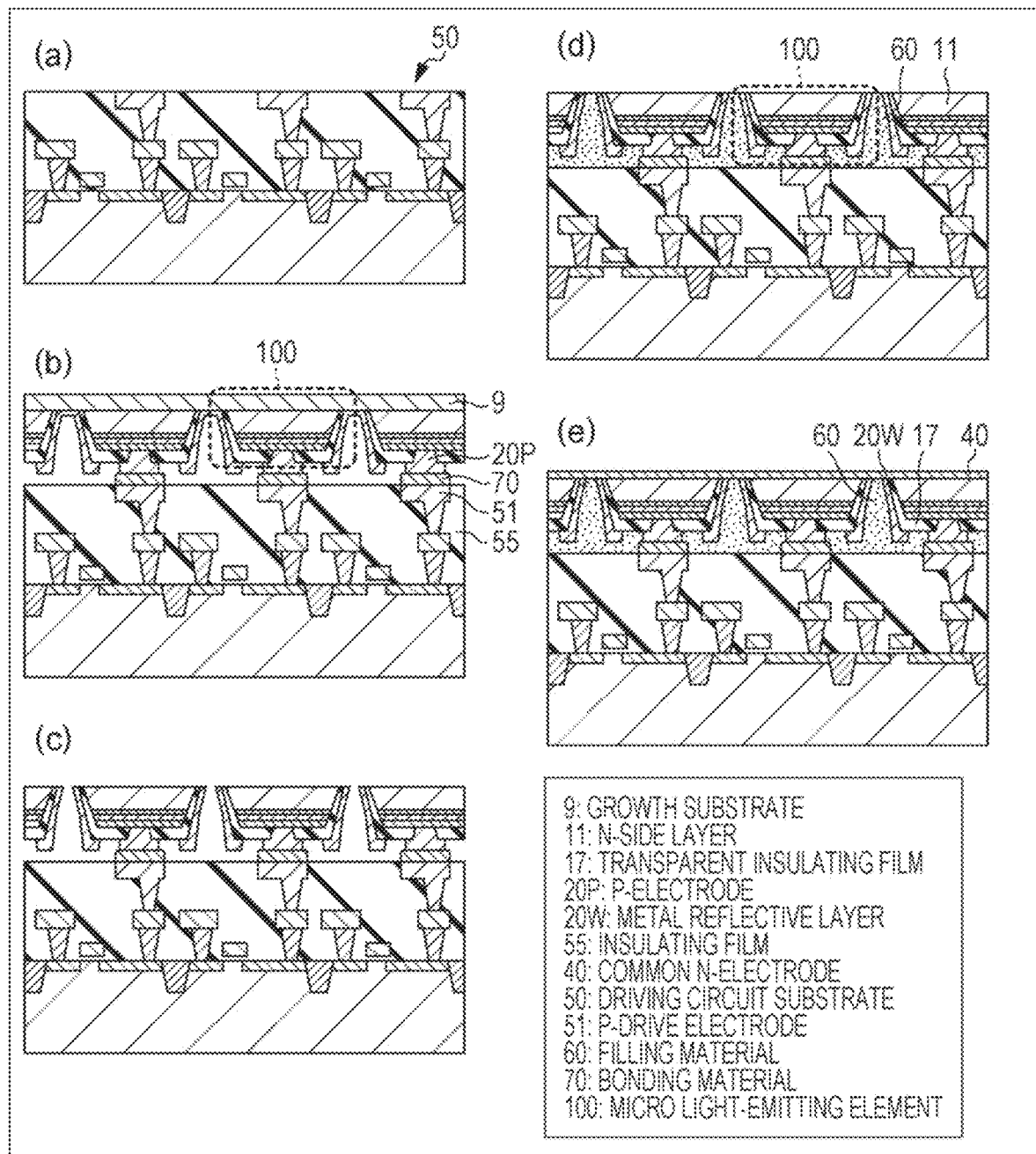
FIGS. 3(a) to 3(e) are schematic sectional views illustrating a manufacturing flow of the image display element according to Embodiment 1 of the present invention.

Next, the manufacturing flow of the image display element 200 will be described using FIG. 3. FIGS. 3(*a*) to 3(*e*) are schematic sectional views illustrating the manufacturing flow of the image display element 200 according to Embodiment 1 of the present invention. In descriptions of the manufacturing flow of the image display element 200, the growth substrate 9 side is set to be upper, and the driving circuit substrate 50 side is set to be lower.

As illustrated in FIG. 3(*a*), firstly, the driving circuit substrate 50 is manufactured. The driving circuit substrate 50 is formed on, for example, a single crystal silicon substrate (wafer) by a general CMOS process. Here, each of the micro light emitting element 100 and the driving circuit substrate 50 may be in a wafer state, and the micro light emitting element 100 may be divided in a unit of the image display element 200. Alternatively, both the micro light emitting element 100 and the driving circuit substrate 50 may be divided in a unit of the image display element 200.

After the driving circuit substrate 50 is manufactured, as illustrated in FIG. 3(*b*), the micro light emitting element 100 and the dummy connection element 101 are stuck to the driving circuit substrate 50. The bonding material 70 is formed on the P-drive electrode 51 and the N-drive electrode 52 of the driving circuit substrate 50. The P-drive electrode 51 and the N-drive electrode 52 are physically and electrically connected to the P-electrode 20P and the N-electrode 20N through the bonding material 70, respectively. At this time, the P-electrode 20P and the N-electrode 20N are precisely aligned to overlap the corresponding P-drive electrode 51 and N-drive electrode 52.

The bonding material 70 is a conductive connection member and is a gold bump, a conductive paste of gold or silver, an anisotropic conductive film (ACF), or nanoparticles of gold, silver, palladium, or the like. The bonding material 70 can be omitted when the P-electrode 20P and the P-drive electrode 51 can be bonded directly. As illustrated in FIG. 3(*c*), the growth substrate 9 is separated to be removed. Various methods such as grinding, polishing, plasma etching, wet etching, sacrificial layer wet etching, and laser lift-off can be used to remove the growth substrate 9. At this time, processing, for example, removing of a portion of the N-side layer 11 may be performed.

After the growth substrate 9 is removed, as illustrated in FIG. 3(*d*), a space between the micro light emitting elements 100 is filled with the filling material 60. Here, for example, transparent silicon resin is used as the filling material 60. Dry etching, wet washing, and the like are performed to expose the N-side layer 11 of the micro light emitting element 100. Then, as illustrated in FIG. 3(*e*), the common N-electrode 40 is deposited to cover the exposed portions of the N-side layer 11, the transparent insulating film 17, the metal reflective layer 20W, and the filling material 60. Here, for example, an ITO film is used as the common N-electrode 40. With the above-described processes, the image display element 200 is formed.

(Light Emission Efficiency of Micro Light Emitting Element 100)

Light emission efficiency of the micro light emitting element 100 formed in a manner as described above was evaluated. Regarding the micro light emitting element 100, the arrangement pitch is 10 μm, the shape is a square, the inclined angle θb is 800, the inclined angle θe is 500, the thickness of the P-side layer 13 is 100 nm, and the thickness of the N-side layer 11 is 6 m. In addition, the size of the upper surface of the N-side layer 11 is 8 μm×8 μm, and the depth D at a portion occupied by the N-side layer 11 in the slope 16S is 1 μm.

The depth D is a depth in the vertical direction (direction from the upper surface of the micro light emitting element 100 toward the lower surface). The compound semiconductor 14 is a nitride semiconductor. The N-side layer 11 is a GaN layer. The light emission layer 12 is a multiple quantum well layer with InGaN and GaN. The peak wavelength of light emitted from the light emission layer 12 is 450 nm.

Figure 4:
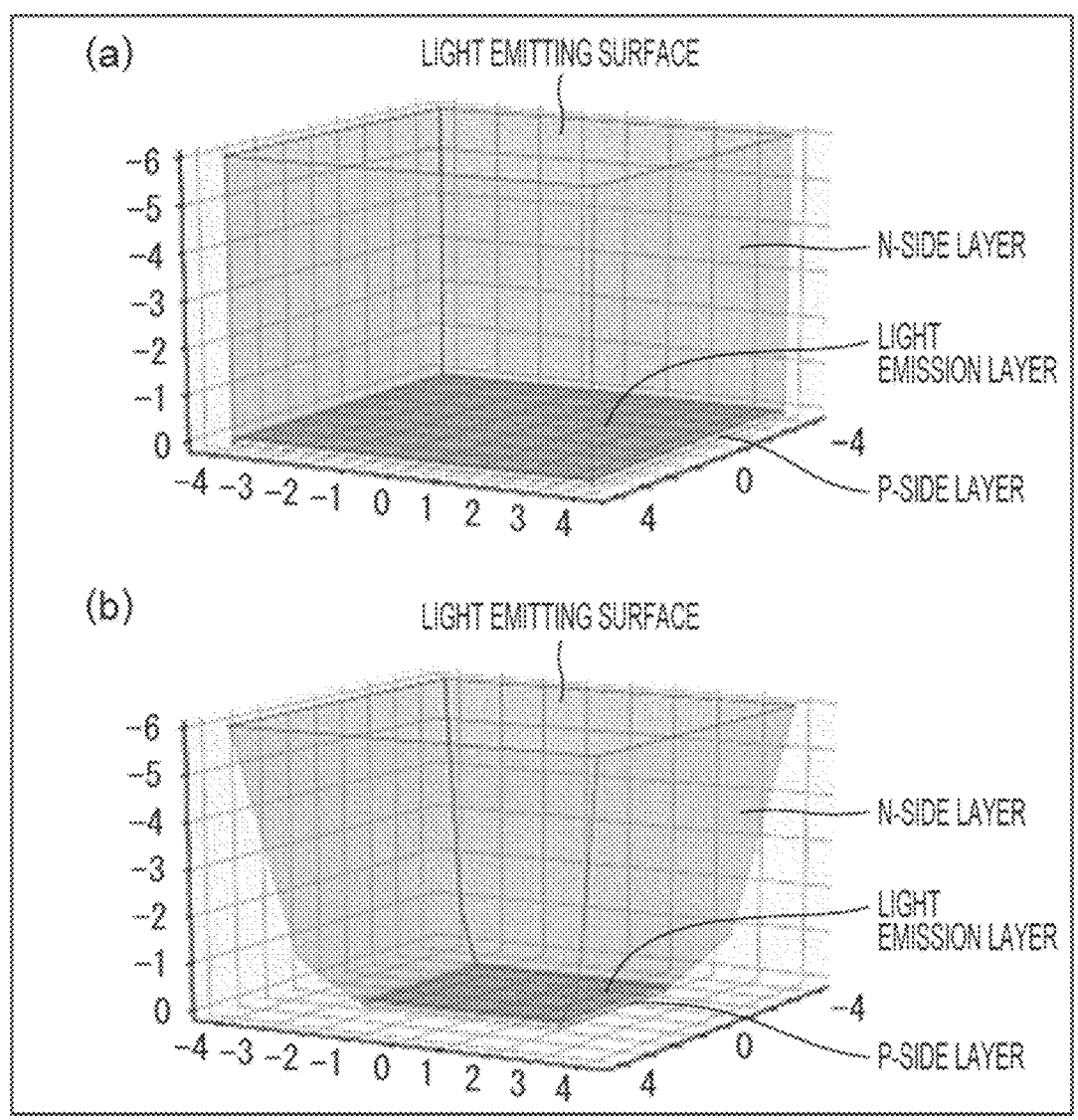
FIG. 4(a) is an aerial view of the micro light emitting element having a rectangular parallelepiped structure.
FIG. 4(b) is an aerial view of the micro light emitting element 100 having a truncated bent pyramid type structure according to Embodiment 1 of the present invention.

FIG. 4(*a*) is an aerial view of the micro light emitting element having a rectangular parallelepiped structure. FIG. 4(*b*) is an aerial view of the micro light emitting element 100 having a truncated bent pyramid type structure according to Embodiment 1 of the present invention. The micro light emitting element having the rectangular parallelepiped structure illustrated in FIG. 4(*a*) and the micro light emitting element 100 having a truncated bent pyramid type structure illustrated in FIG. 4(*b*) according to Embodiment 1 of the present invention were compared to each other.

In all cases of FIG. 4(*a*) and FIG. 4(*b*), the size of the upper surface of the N-side layer 11 was 8 μm×8 μm, and the same compound semiconductor was used. In the cases of FIG. 4(*a*) and FIG. 4(*b*), the constituent materials and the formation processes are the same as each other except for a different shape. In the case of FIG. 4(a), the separation trench and the isolation trench were processed to be inclined as small as possible.

In all the cases, a transparent resin layer containing a scattering material was disposed on the upper surface of the N-side layer. In addition, in all the cases, 10000 pieces of micro light emitting elements in 100 rows×100 columns were simultaneously turned on, so as to evaluate total luminous flux intensity. The current amount per one micro light emitting element 100 is 5 μA. The following Table 1 shows measurement results.

TABLE 1

|  | Rectangular parallelepiped structure | Truncated bent pyramid type structure |
| --- | --- | --- |
| External quantum efficiency | 12% | 43% |
| Area ratio of light emission layer to light emitting surface | 100% | 32% |
| Estimated effective internal quantum efficiency | 66% | 53% |

As shown in Table 1, in the truncated bent pyramid type structure in FIG. 4(b), external quantum efficiency is 3.6 times that of the simple rectangular parallelepiped structure in FIG. 4(a). In the truncated bent pyramid type structure in FIG. 4(b), even though the area of the light emission layer is about ⅓ of the area of the rectangular parallelepiped structure in FIG. 4(a), large improvement is achieved. To investigate root cause of the improvement, the light extraction efficiency was simulated with a lay trace method. The following Table 2 shows results. Estimated effective internal quantum efficiency in Table 1 is an estimated value obtained by being calculated from the external quantum efficiency in Table 1 with the light extraction efficiency in Table 2. Values shown in Table 2 are simulation values.

TABLE 2

|  | Rectangular parallelepiped structure | Truncated bent pyramid type structure |
| --- | --- | --- |
| Light extraction efficiency | 17.9% | 80.7% |
| Side surface absorption | 29.4% | 8.8% |
| Bottom surface absorption | 29.5% | 6.0% |
| Internal absorption | 23.2% | 4.5% |
| Average internal reflection number | 85.4 | 25.4 |

The light extraction efficiency indicates a proportion of the quantity of light emitted from the upper surface of the micro light emitting element into the transparent resin layer. Side surface absorption indicates a proportion of the quantity of light absorbed by the metal reflective layer 20W on the entire side surface of the micro light emitting element. Bottom surface absorption indicates a proportion of the quantity of light absorbed by the P-side metal layer 10 on the lower surface of the micro light emitting element. Internal absorption indicates a proportion of the quantity of light absorbed again by the light emission layer 12. The average internal reflection number indicates an average of reflections in the compound semiconductor 14 until light emitted from the light emission layer 12 is emitted to the outside or is absorbed by the metal reflective layer 20W.

The tendency of the light extraction efficiency in Table 2 coincides well with the tendency of the external quantum efficiency in Table 1. It is considered that a difference in external quantum efficiency is the main cause of a difference in light extraction efficiency. Only light incident to the upper surface of the micro light emitting element at an angle which is equal to or less than a critical total reflection angle is emitted to the outside from the upper surface of the micro light emitting element. The critical total reflection angle is about 37° in a case of light which is incident from GaN to the transparent resin layer.

In the rectangular parallelepiped structure in FIG. 4(a), an incident angle to the upper surface of the micro light emitting element is constant regardless of the number of reflections therein. Thus, light emitted from the light emission layer 12 in a horizontal direction is not emitted to the outside. On the contrary, in the truncated bent pyramid type structure in FIG. 4(b), light emitted from the light emission layer 12 in the horizontal direction is reflected upward by the slope 16S, is incident to the light emitting surface at an angle of the critical total reflection angle or less, and then is emitted to the outside.

Further, even in a case where light is not emitted to the outside in an initial state when the light is emitted from the light emission layer 12, every time the light is reflected by the N-side layer side surface 11S, the incident angle of the light to the upper surface of the micro light emitting element 100 changes.

Therefore, light emitted from the light emission layer 12 repeats internal reflection, and then is emitted to the outside. Accordingly, it is possible to significantly improve the light extraction efficiency.

Figure 5:
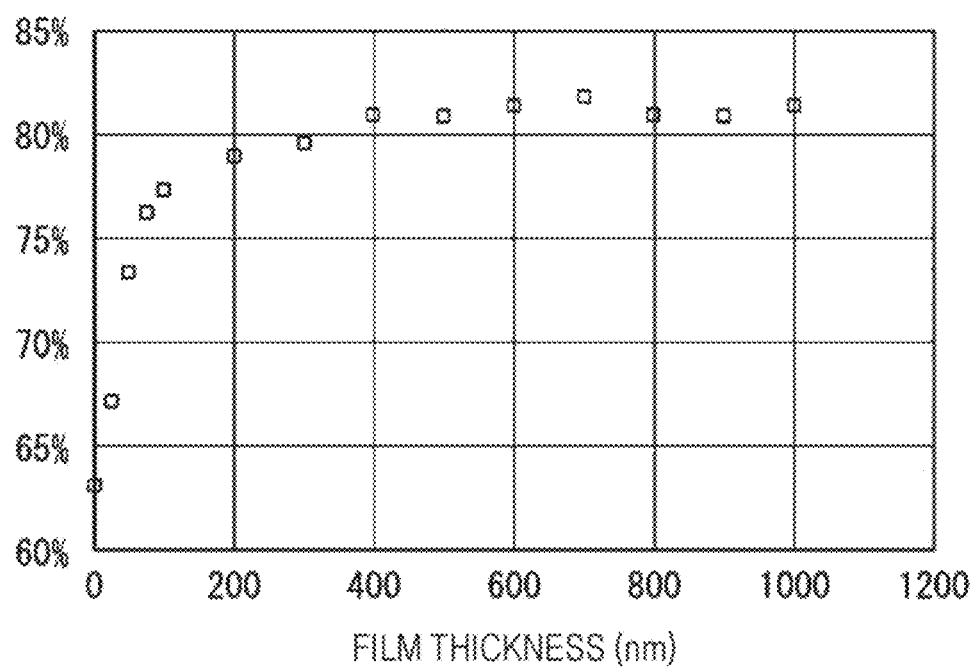
FIG. 5 is a diagram illustrating a simulation result of film thickness dependency of a transparent insulating film in light extraction efficiency.

Next, in order to examine an influence of the transparent insulating film 17, dependency of the light extraction efficiency on the film thickness of the transparent insulating film 17 in the micro light emitting element 100 according to one form of the present invention was simulated. FIG. 5 illustrates results in a case of using $SiO_2$ as the transparent insulating film 17. FIG. 5 is a diagram illustrating a simulation result of film thickness dependency on the transparent insulating film 17 at the light extraction efficiency.

In FIG. 5, a horizontal axis indicates the film thickness, and a vertical axis indicates light extraction efficiency. In a case where the transparent insulating film 17 is not provided, the light extraction efficiency is 63%. Thus, in the truncated bent pyramid type structure in which the transparent insulating film 17 is not provided, light extraction efficiency is much larger than that of the rectangular parallelepiped structure with the transparent insulating film 17. It is shown that the shape of the compound semiconductor 14 is very important.

The light extraction efficiency increases as the film thickness of the transparent insulating film 17 becomes thicker. However, in a case where the film thickness of the transparent insulating film 17 is equal to or more than 400 nm, the change is small. Thus, it is most preferable that the film thickness of the transparent insulating film 17 is equal to or more than 400 nm. Since the decrease rate of the light extraction efficiency is within 5% if the film thickness is equal to or more than 75 nm, the film thickness may be equal to or more than at least 75 nm.

As the effect by the transparent insulating film 17, it is considered to improve reflectivity on the side surface of the micro light emitting element 100 and to improve the light extraction efficiency. In the rectangular parallelepiped structure, the effect by the transparent insulating film 17 is very weak. The reason is considered as follows. Even though the reflectivity on the side surface of the micro light emitting element having the rectangular parallelepiped structure is improved, the angle incident to the upper surface of the micro light emitting element is not changed. Thus, light which is totally reflected by the upper surface is always reflected no matter how many times the light is reflected at side surfaces, and the light extraction efficiency is not improved. Thus, it is important that the micro light emitting element 100 has the slope 16S and the inclined N-side layer side surface 11S which allow the incident angle to the upper surface to change.

Figure 6:
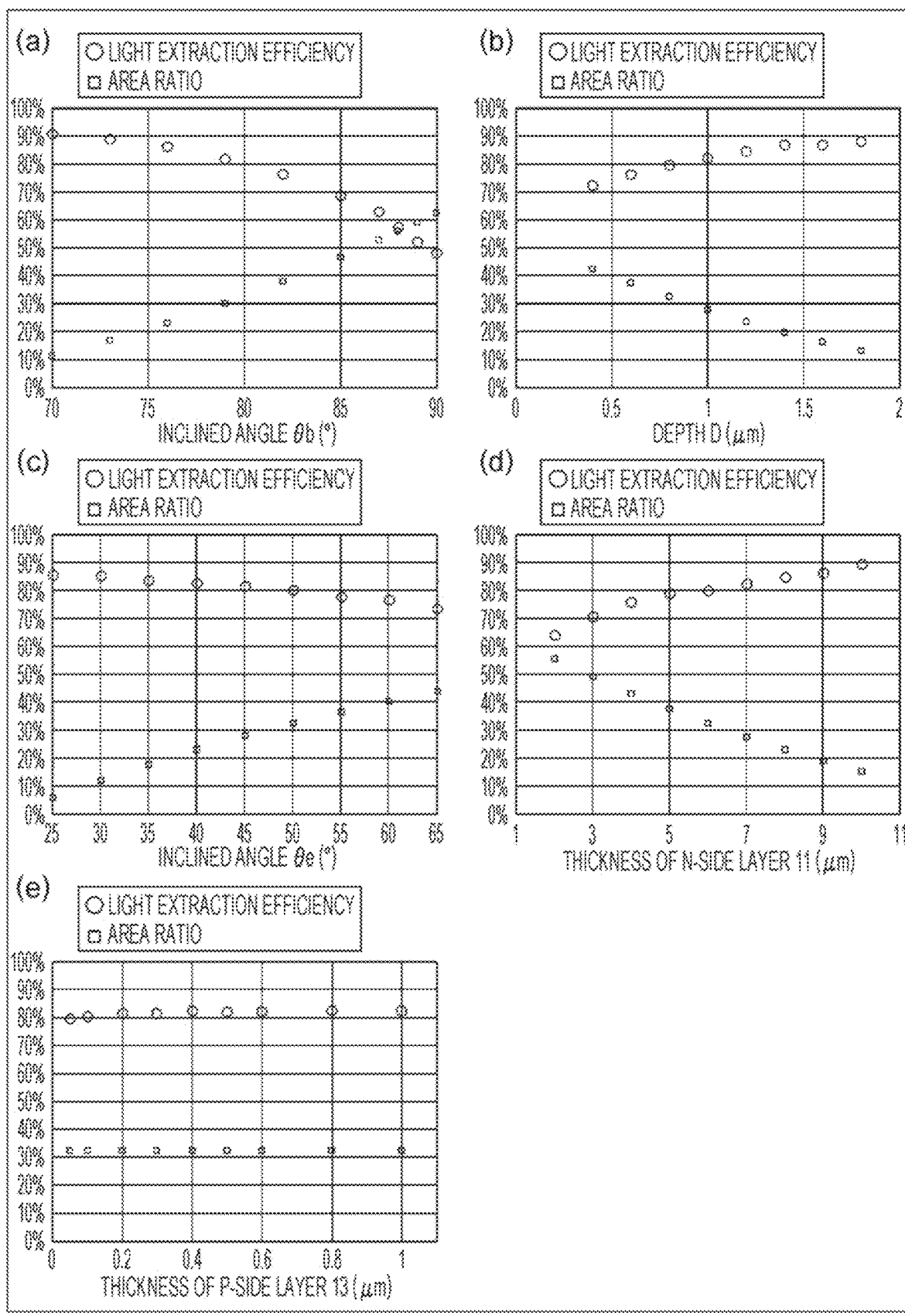
FIGS. 6(a) to 6(e) are diagrams illustrating simulation results of dependency of the light extraction efficiency on dimensions and angles of each unit in the image display element illustrated in FIG. 1(a).

Next, FIG. 6 illustrates results obtained by examining the change of the light extraction efficiency to the dimensions and the angles of each unit in the micro light emitting element 100 with the simulation. FIGS. 6(a) to 6(e) are diagrams illustrating simulation results of dependency of the light extraction efficiency on the dimensions and the angles of each unit in the image display element 200 illustrated in FIG. 1(a). FIGS. 6(a) to 6(e) also illustrate ratios (area ratio) of the area of the light emission layer 12 to the area of the light emitting surface (upper surface of the N-side layer 11). In FIGS. 6(a) to 6(e), a vertical axis indicates the light extraction efficiency or the area ratio.

In all cases in FIGS. 6(a) to 6(e), so long as particular statements are not made, the size of the upper surface of the N-side layer 11 is 8 μm×8 μm, the thickness of the N-side layer 11 is 6 μm, and the thickness of the P-side layer 13 is 0.1 μm. In addition, the inclined angle θe of the slope 16S is 500, the depth D at the portion occupied by the N-side layer 11 in the slope 16S is 1 μm, and the inclined angle θb of the N-side layer side surface 11S is 800.

FIG. 6(a) illustrates dependency of the light extraction efficiency on the inclined angle θb of the N-side layer side surface 11S. In FIG. 6(a), a horizontal axis indicates the inclined angle θb. As illustrated in FIG. 6(a), as the inclined angle θb of the N-side layer side surface 11S becomes smaller, the light extraction efficiency is improved. Preferably, the inclined angle θb of the N-side layer side surface 11S is equal to or less than 83°.

FIG. 6(b) illustrates dependency of the light extraction efficiency on the depth D at the portion occupied by the N-side layer 11 in the slope 16S. In FIG. 6(b), a horizontal axis indicates the depth D. As illustrated in FIG. 6(b), as the depth D increases, the light extraction efficiency is improved. Preferably, the depth D is equal to or more than 0.6 μm.

FIG. 6(c) illustrates dependency of the light extraction efficiency on the inclined angle θe of the slope 16S. In FIG. 6(c), a horizontal axis indicates the inclined angle θe. In order to improve the light extraction efficiency, the inclined angle θe is preferably equal to or less than 600, and further preferably equal to or less than 500. FIG. 6(d) illustrates dependency of the light extraction efficiency on the thickness of the N-side layer 11. The thickness is a thickness in the vertical direction (direction from the upper surface of the micro light emitting element 100 toward the lower surface). In FIG. 6(d), a horizontal axis indicates the thickness of the N-side layer 11. As the thickness of the N-side layer 11 becomes thicker, the light extraction efficiency is improved. The thickness of the N-side layer 11 is preferably equal to or more than 3 μm.

FIG. 6(e) illustrates dependency of the light extraction efficiency on the thickness of the P-side layer 13. In FIG. 6(e), a horizontal axis indicates the thickness of the P-side layer 13. As the thickness of the P-side layer 13 becomes thicker, the light extraction efficiency is improved. However, the influence is smaller than those of other parameters illustrated in FIGS. 6(a) to 6(d).

With the drawings, the micro light emitting element 100 according to one form of the present invention can realize light extraction efficiency which is equal to or more than at least 48%. This exhibits very large improvement of about 2.7 times the light extraction efficiency in the rectangular parallelepiped structure, which is shown in Table 2. Further, in the micro light emitting element 100 according to the one form of the present invention, it is possible to realize the light extraction efficiency of 70% or more by appropriately selecting the structure of the micro light emitting element 100.

In the micro light emitting element 100 according to the one form of the present invention, the entire periphery of the side surface of the light emission layer 12 is configured as the portion of the slope 16S, and the N-side layer side surface 11S from the slope 16S to the upper surface of the N-side layer 11 is inclined by an angle larger than the angle of the slope 16S. In addition, in the micro light emitting element 100, the slope 16S and the N-side layer side surface 11S are covered by the metal reflective layer 20W.

Thus, it is possible to prevent the occurrence of optical crosstalk between the micro light emitting elements 100 and to significantly improve the light extraction efficiency. Further, since the transparent insulating film 17 is disposed between the slope 16S and the N-side layer side surface 11S, and the metal reflective layer 20W, it is possible to further improve the light extraction efficiency.

Embodiment 2

(Configuration of Image Display Element 200a) Another embodiment of the present invention will be described below with reference to FIGS. 7 and 8. For easy description, members having the same functions as the members described in the above embodiment are denoted by the same reference signs, and repetitive descriptions thereof will not be made. An image display element 200a in Embodiment 2 is different from the image display element 200 in Embodiment 1 in that sticking between the driving circuit substrate 50 and the micro light emitting element 100a is performed in a manner of wafer-to-wafer bonding. The wafer-to-wafer bonding has an advantage in that generation of dust is suppressed, and high yield is realized.

Figure 7:
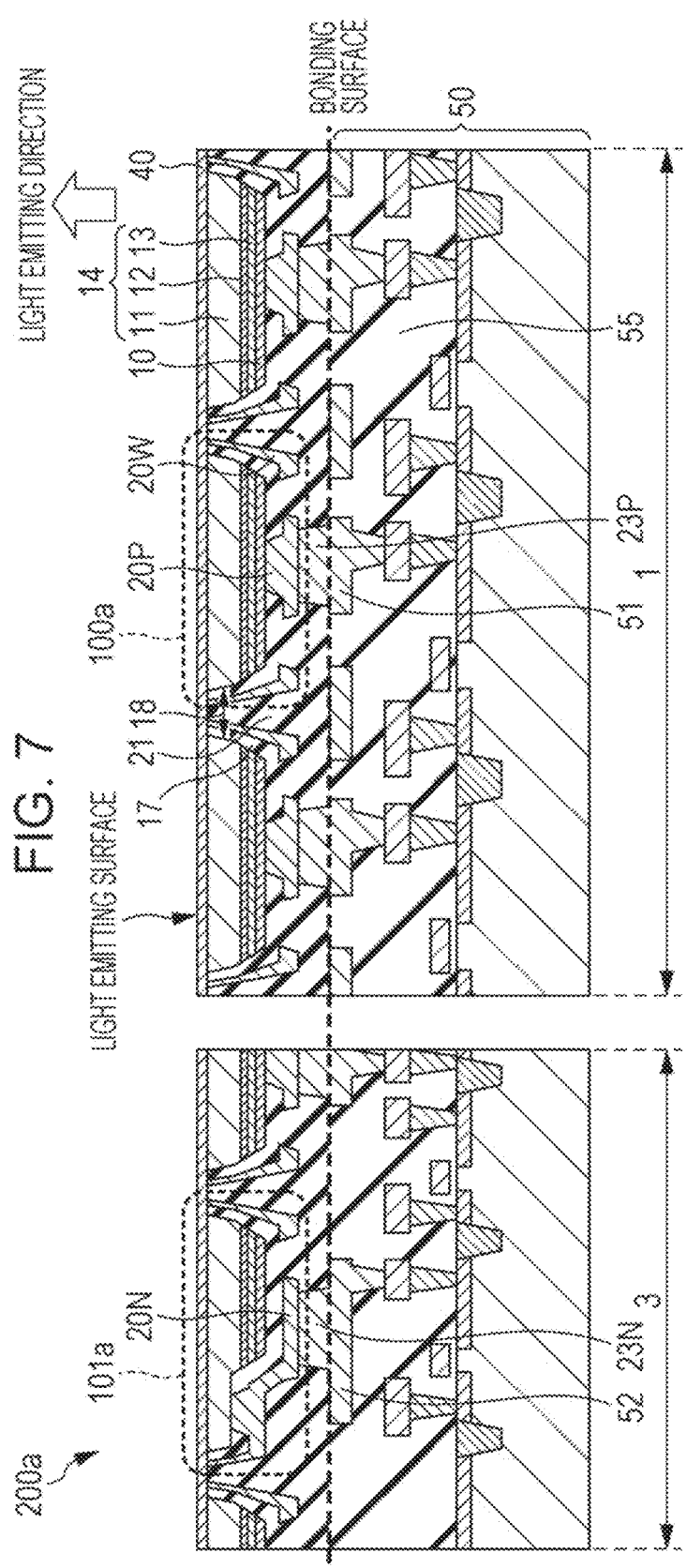
FIG. 7 is a schematic sectional view of an image display element according to Embodiment 2 of the present invention.

FIG. 7 is a schematic sectional view of the image display element 200a according to Embodiment 2 of the present invention. Differing from the micro light emitting element 100, a micro light emitting element 100a is buried by an insulating film 21, and a surface of the micro light emitting element 100a on an opposite side of the light emitting surface is flat. The micro light emitting element 100a and the driving circuit substrate 50 are stuck to each other on a flat bonding surface. A P-damascene electrode 23P and an N-damascene electrode 23N in the micro light emitting element 100a are bonded to the P-drive electrode 51 and the N-drive electrode 52 on the driving circuit substrate 50, respectively.

As described later, the P-damascene electrode 23P and the N-damascene electrode 23N are formed by the same process. Thus, the P-damascene electrode and the N-damascene electrode are formed of the same wiring material regardless of the different shape, size, and depth. That is, the P-damascene electrode 23P and the N-damascene electrode 23N have the same stacked structure including a barrier metal layer, a main conductive layer, a cap layer, and the like. Lower surfaces of the P-damascene electrode 23P and the N-damascene electrode 23N are configured in substantially the same plane as the lower surface of the insulating film 21.

The structure except for the above description is similar to that of the image display element 200 in Embodiment 1.

The surface of the insulating film 55 (on the driving circuit substrate 50 side) on the bonding surface side is also flat, and upper surfaces of the P-drive electrode 51 and the N-drive electrode 52 are configured in substantially the same plane as the upper surface of the insulating film 55. A slight difference in height may be provided between the lower surface of the insulating film 21, and the lower surfaces of the P-damascene electrode 23P and the N-damascene electrode 23N, so long as sticking of the micro light emitting element 100a and the driving circuit substrate 50 is possible. This is similarly applied to a difference in height between the upper surface of the insulating film 55 on the driving circuit substrate 50 side, and the upper surfaces of the P-drive electrode 51 and the N-drive electrode 52.

Normally, a layer constituting the lower surfaces of the P-damascene electrode 23P and the N-damascene electrode 23N has the same material as that of a layer constituting the upper surfaces of the P-drive electrode 51 and the N-drive electrode 52. Examples of the material of the above layers include gold (Au), copper (Cu), and nickel (Ni).

(Manufacturing Flow of Image Display Element 200a)

FIGS. 8(a) to 8(d) are schematic sectional views illustrating a manufacturing flow of the image display element 200a according to Embodiment 2 of the present invention. In descriptions of the manufacturing flow of the image display element 200a in FIGS. 8(a) to 8(c), the insulating film 21 side is set to be upper, and the growth substrate 9 side is set to be lower. In descriptions of the manufacturing flow of the image display element 200a in FIG. 8(d), the growth substrate 9 side is set to be upper, and the driving circuit substrate 50 side is set to be lower.

Figure 8:
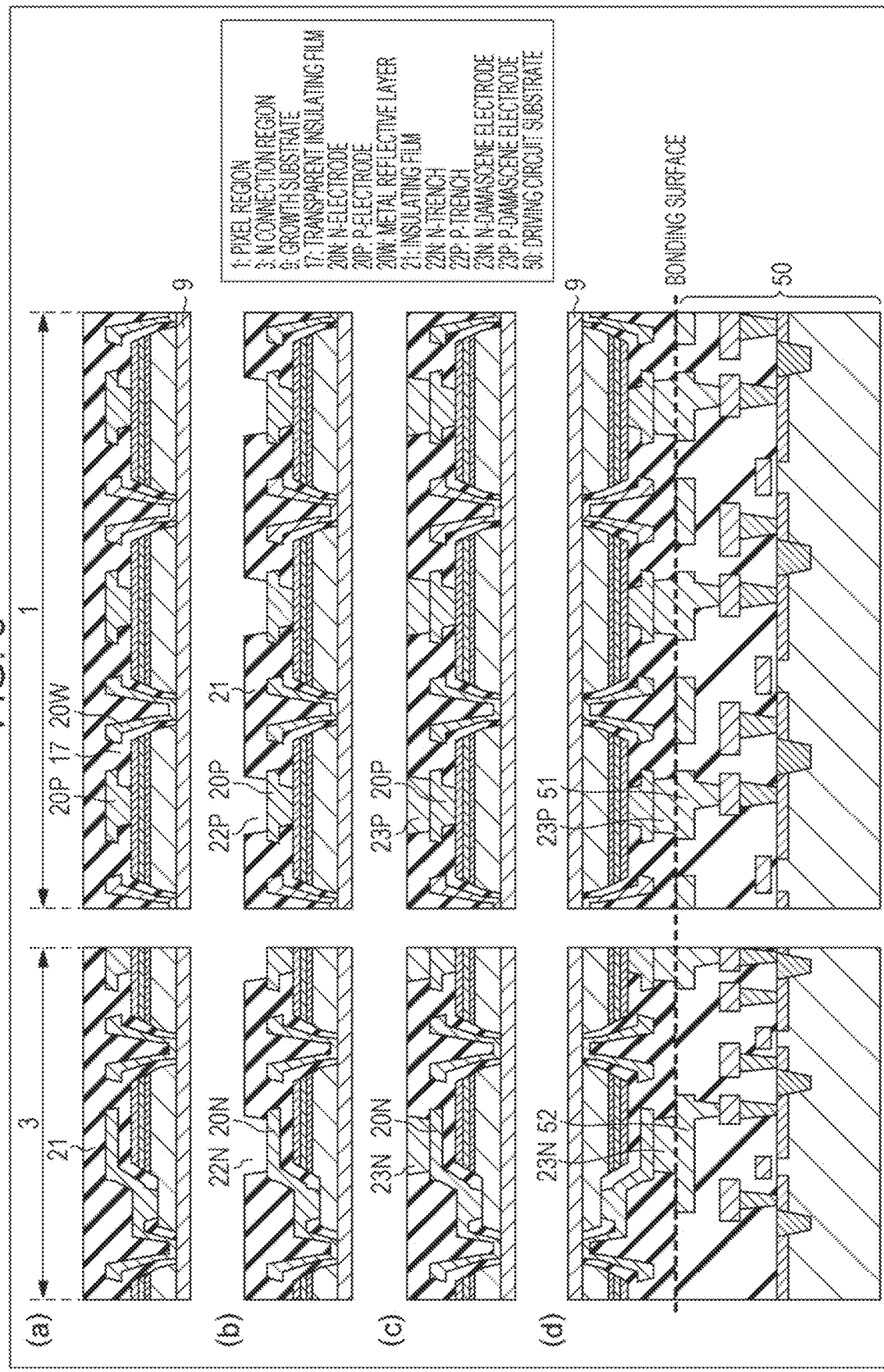
FIGS. 8(a) to 8(d) are schematic sectional views illustrating a manufacturing flow of the image display element according to Embodiment 2 of the present invention.

FIG. 8 illustrates only the pixel region 1 and the N connection region 3 of an image display element 200a, but the manufacturing flow of the image display element 200a is not performed for each image display element 200a. In the manufacturing flow of the image display element 200a, preferably, a plurality of image display elements 200a are manufactured at a time by sticking a wafer for a plurality of driving circuit substrates 50 and a wafer for a plurality of micro light emitting elements 100a to each other.

A portion of the manufacturing flow of the micro light emitting element 100a is the same as the processes for the micro light emitting element 100, which are illustrated in FIGS. 2(a) to 2(g). In the manufacturing flow of the micro light emitting element 100a, after the metal layer 20 is patterned as illustrated in FIG. 8(a), the insulating film 21 is deposited to cover the exposed portions of the P-electrode 20P, the transparent insulating film 17, and the metal reflective layer 20W.

After the insulating film 21 is deposited, the upper surface of the insulating film 21 is flattened by a chemical-mechanical-polishing (CMP) method. The insulating film 21 is, for example, a film of $SiO_2$, SiN, SiON or a film obtained by stacking these film. Various film formation technologies such as a chemical vapor deposition (CVD) method, a sputtering method, and a coating method can be used for forming the insulating film 21.

After the insulating film 21 is flattened, as illustrated in FIG. 8(b), a P-trench 22P and an N-trench 22N are formed in the insulating film 21 on the P-electrode 20P and the N-electrode 20N, respectively. The P-trench 22P has a hole shape and reaches the P-electrode 20P. The N-trench 22N has a hole shape or a line shape and reaches the N-electrode 20N.

After the P-trench 22P and the N-trench 22N are formed, as illustrated in FIG. 8(c), the P-damascene electrode 23P and the N-damascene electrode 23N are formed by burying a metal film in the P-trench 22P and the N-trench 22N with a damascene method. The metal film is, for example, a combination of copper and a barrier film of tantalum (Ta), tungsten (W), and titanium nitride (TiN). The metal film may be a combination of gold (Au), nickel (Ni) or the like with the corresponding barrier film.

In the damascene method, a metal thin film is deposited on an underlying structure having a trench, and the metal thin film is polished by a CMP method. Thus, the metal thin film can remain in the trench, and the upper surface of the underlying structure is level with the upper surface of the metal thin film. In the above-described manner, the P-damascene electrode 23P is disposed on the P-electrode 20P, and the N-damascene electrode 23N is disposed on the N-electrode 20N. The P-damascene electrode 23P and the N-damascene electrode 23N are configured with the same material. The upper surface of each of the P-damascene electrode 23P and the N-damascene electrode 23N are level with the surface, which functions as the bonding surface to the driving circuit substrate 50.

After the P-damascene electrode 23P and the N-damascene electrode 23N are formed, as illustrated in FIG. 8(d), the micro light emitting element 100a and the dummy connection element 101a are stuck to the driving circuit substrate 50. At this time, the P-damascene electrode 23P and the N-damascene electrode 23N are precisely aligned to overlap with the corresponding P-drive electrode 51 and N-drive electrode 52, respectively.

Two wafers are stuck to each other by plasma cleaning of the surface, activation by ion irradiation, heating, and pressurization, in accordance with the material of the bonding surface between the micro light emitting element 100a and the dummy connection element 101a, and the driving circuit substrate 50. In the subsequent processes, similar to the processes illustrated in FIGS. 3(c) to 3(e), the growth substrate 9 is removed, and the common N-electrode 40 is formed. In the manufacturing flow of the micro light emitting element 100a, since the insulating film 21 is deposited between the micro light emitting elements 100a, the filling material 60 is not required.

In the configuration of the image display element 200a, the periphery of the micro light emitting element 100a is covered by the metal reflective layer 20W. Thus, even though the transparent insulating film is deposited between the micro light emitting elements 100a, the occurrence of light leakage between the micro light emitting elements 100a adjacent to each other is prevented. Thus, even though an insulating film such as $SiO_2$, which is generally used, is used, it is possible to prevent an occurrence of a problem that contrast and color purity are degraded.

As described above, since the wafers are stuck to each other, it is possible to reduce dust generation and to realize high yield. For example, if the micro light emitting elements are divided in a unit of the image display element, a large amount of dust is generated in the division process. Thus, a problem that the yield is significantly decreased by the bonding occurs, because the dusts are adhered to the bonding surface in a process of sticking the micro light emitting element to the driving circuit substrate.

If the micro light emitting element 100a and the driving circuit substrate 50 are both in the wafer state, such a problem does not occur. In a case where the micro light emitting element and the driving circuit substrate are stuck to each other for each image display element, a time of about 1 to several minutes is required for one sticking process. Thus, production efficiency is low. However, in the process of sticking the wafers to each other, the plurality of micro light emitting elements 100a serving as one wafer and the plurality of driving circuit substrates 50 serving as one wafer are bonded to each other at a time. Thus, it is possible to largely improve the production efficiency.

Preferably, the material of the wafer for the plurality of micro light emitting elements 100a is the same as the material of the wafer for the plurality of driving circuit substrates 50. The reason is as follows. That is, in sticking of the wafers, heating may be required. If the materials of both the wafers are the same as each other, it is possible to suppress a shift of a pattern occurring by a difference in thermal expansion coefficient. Further, preferably, the sizes of both the wafers are equal to each other. The reason is that, if the sizes of both the wafers are not equal to each other, a wasteful region which is not used is appeared on the larger wafer side.

As described above, similar to Embodiment 1, in the configuration of the image display element 200a, it is also possible to improve the light extraction efficiency by the metal reflective layer 20W and to prevent the occurrence of light leakage between the micro light emitting elements 100a adjacent to each other. Further, it is possible to further improve the light extraction efficiency by the transparent insulating film 17.

Embodiment 3

(Configuration of Image Display Element 200b)

Figure 9:
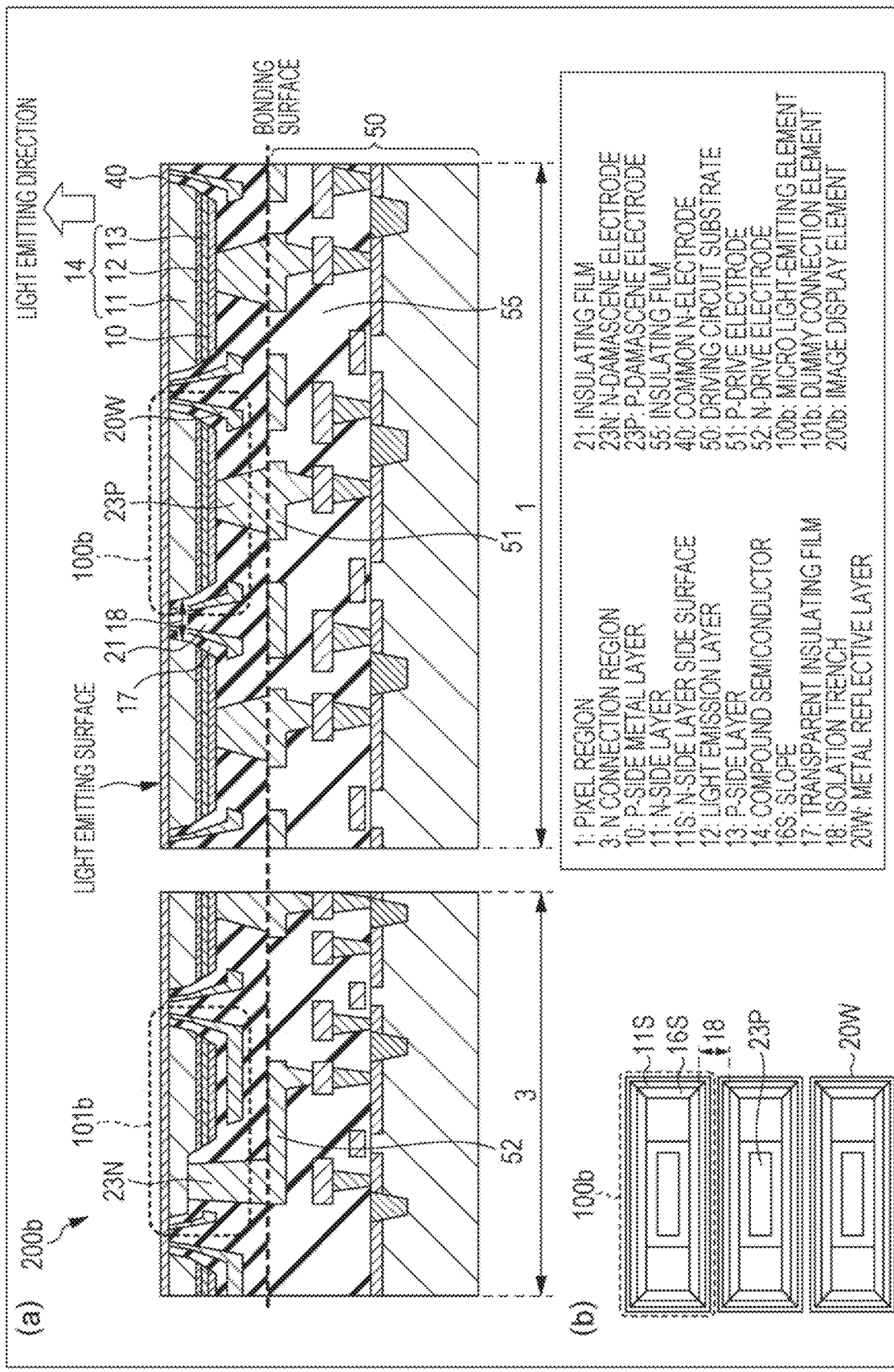
FIG. 9(a) is a schematic sectional view of an image display element according to Embodiment 3 of the present invention.
FIG. 9(b) is a schematic plan view of a micro light emitting element according to Embodiment 3 of the present invention.
Figure 10:
FIGS. 10(a) to 10(g) are schematic sectional views illustrating a manufacturing flow of the image display element according to Embodiment 3 of the present invention.

Still another embodiment of the present invention will be described below with reference to FIGS. 9 and 10. For easy description, members having the same functions as the members described in the above embodiment are denoted by the same reference signs, and repetitive descriptions thereof will not be made. An image display element 200b in Embodiment 3 is different from the image display element 200a in Embodiment 2 in that the P-electrode 20P and the N-electrode 20N are not provided, and the P-damascene electrode 23P and the N-damascene electrode 23N are directly connected to the P-side metal layer 10 of the micro light emitting element 100b and the N-side layer 11 of a dummy connection element 101b, respectively. The image display element 200b is the same as the image display element 200a except for the above points.

FIG. 9(a) is a schematic sectional view of an image display element 200b according to Embodiment 3 of the present invention. FIG. 9(b) is a schematic plan view of a micro light emitting element 100b according to Embodiment 3 of the present invention. In the configuration of the image display element 200b, it is possible to omit the process of forming the P-contact hole 19P and the N-contact hole 19N, and thus it is possible to reduce the processes in comparison to the image display element 200a in Embodiment 2.

Further, as illustrated in FIG. 9(b), it is easy to form an elongated rectangular micro light emitting element 100b. In the image display element 200a in Embodiment 2, since the metal reflective layer 20W and the P-electrode 20P are processed by the same photolithographic process, it is necessary to secure a space having at least the minimum line width between the metal reflective layer 20W and the P-electrode 20P. Therefore, the width of the P-electrode 20P is to be narrow.

Thus, if the width of the P-side metal layer 10 is narrow, it is difficult to secure an installation area for the P-electrode 20P. However, in the configuration of the image display element 200b, the P-damascene electrode 23P may be formed not to come into contact with the metal reflective layer 20W, and a space necessary for alignment may be secured. Thus, the configuration of the image display element 200b can be applied to a case where the P-side metal layer 10 is narrower than that in the configuration of the image display element 200a.

(Manufacturing Flow of Image Display Element 200b)

FIGS. 10(a) to 10(g) are schematic sectional views illustrating a manufacturing flow of the image display element 200b according to Embodiment 3 of the present invention. In descriptions of the manufacturing flow of the image display element 200b in FIGS. 10(a) to 10(e), the metal layer 20 side is set to be upper, and the growth substrate 9 side is set to be lower. In the manufacturing flow of the image display element 200b, the processes illustrated in FIGS. 2(a) to 2(d) are performed, and then, as illustrated in FIG. 10(a), the metal layer 20 is deposit without forming the P-contact hole 19P.

After the metal layer 20 is deposited, as illustrated in FIG. 10(b), the metal layer 20 is processed to obtain the metal reflective layer 20W. At this time, portions of the metal layer 20, which are above the P-side metal layer 10 and the N-contact trench 15N are removed. Then, as illustrated in FIG. 10(c), the insulating film 21 is deposited to cover exposed portions of the transparent insulating film 17 and the metal reflective layer 20W. The upper surface of the insulating film 21 is flattened by the CMP method.

After the upper surface of the insulating film 21 is flattened, as illustrated in FIG. 10(d), the P-trench 22P is formed on the P-side metal layer 10 in the pixel region 1, and the N-trench 22N is formed on the N-contact trench 15N in the N connection region 3. Specifically, the P-trench 22P is formed by removing the insulating film 21 and the transparent insulating film 17 on the P-side metal layer 10. The N-trench 22N is formed by removing the insulating film 21 and the transparent insulating film 17 on the N-side layer 11 in the N-contact trench 15N.

Further, as illustrated in FIG. 10(e), the P-damascene electrode 23P is formed in the P-trench 22P, and the N-damascene electrode 23N is formed in the N-trench 22N. After the P-damascene electrode 23P and the N-damascene electrode 23N are formed, as illustrated in FIG. 10(f), the plurality of micro light emitting elements 100b and the driving circuit substrate 50 are stuck to each other. Then, as illustrated in FIG. 10(g), the growth substrate 9 is removed, and the common N-electrode 40 is deposited to cover the exposed portions of the N-side layer 11, the transparent insulating film 17, the metal reflective layer 20W, and the filling material 60.

As described above, similar to Embodiment 1, in the configuration of the image display element 200b, it is also possible to improve the light extraction efficiency by the metal reflective layer 20W and to prevent the occurrence of light leakage between the micro light emitting elements 100b adjacent to each other. As described above, similar to the image display element 200a in Embodiment 2, in the configuration of the image display element 200b, since the wafers are stuck to each other, it is possible to improve productivity, to reduce the dust generation, and to realize high yield.

Embodiment 4

(Configuration of Image Display Element 200c)

Figure 12:
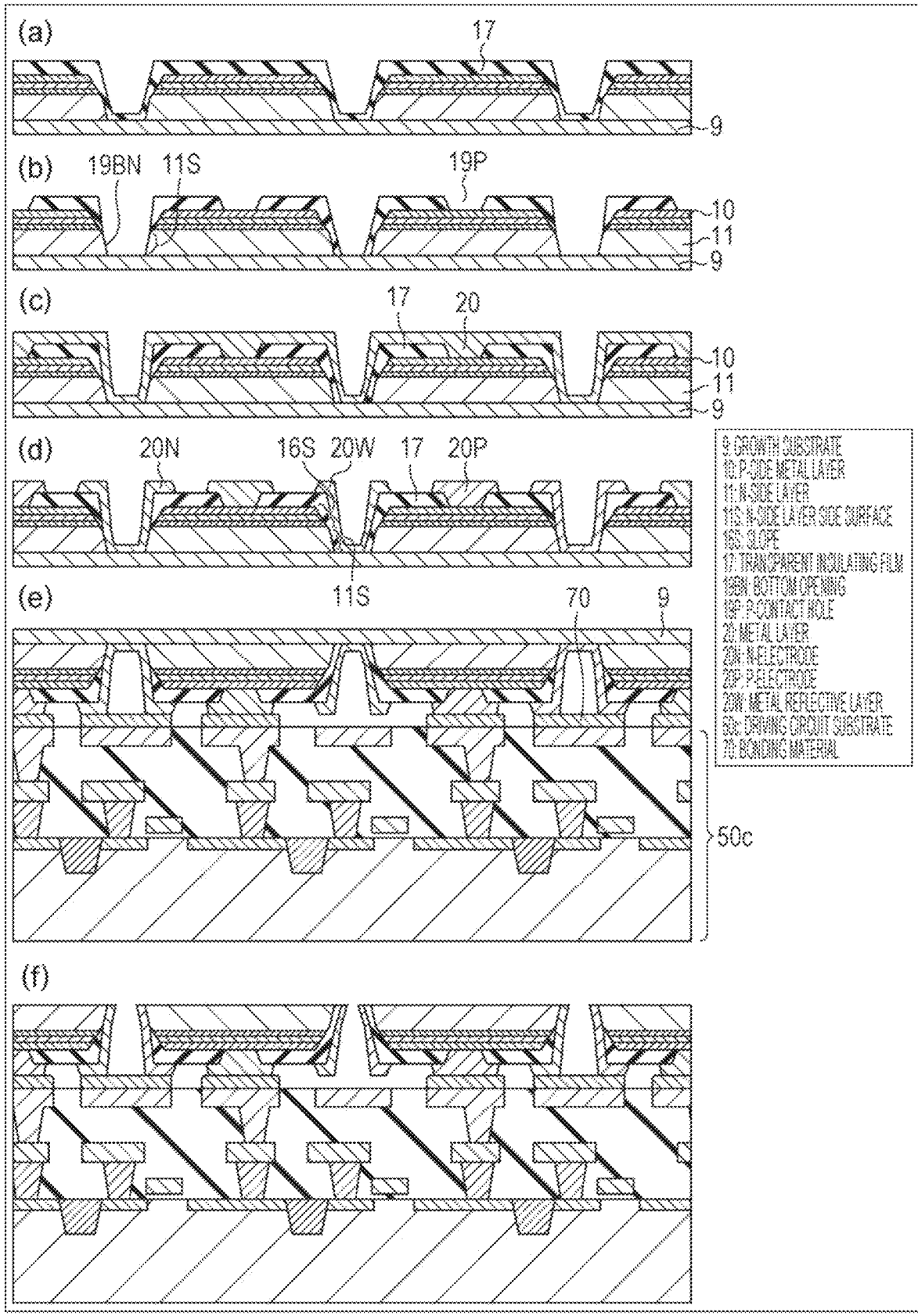
FIGS. 12(a) to 12(f) are schematic sectional views illustrating a manufacturing flow of the image display element according to Embodiment 4 of the present invention.

Still another embodiment of the present invention will be described below with reference to FIGS. 11 and 12. For easy description, members having the same functions as the members described in the above embodiment are denoted by the same reference signs, and repetitive descriptions thereof will not be made. An image display element 200c in Embodiment 4 is different from the image display element 200 in Embodiment 1 in that a micro light emitting element 100c includes the P-electrode 20P and the N-electrode 20N on the lower surface of the micro light emitting element. In FIG. 11, the image display element 200c is not filled with the filling material 60. However, similar to Embodiment 1, the image display element may be filled with the filling material 60.

In addition, the image display element 200c is different from the image display element 200 in that a driving circuit substrate 50c includes the N-drive electrode 52 in the pixel region 1, and there is a portion at which the transparent insulating film 17 is not provided between the metal reflective layer 20W and the N-side layer side surface 11S. The image display element 200c is the same as the image display element 200 except for the above points.

FIG. 11 is a schematic sectional view of the pixel region 1 in the image display element 200c according to Embodiment 4 of the present invention. The configuration of the image display element 200c has an additional advantage in that, after the micro light emitting element 100c is stuck to the driving circuit substrate 50c, it is not necessary to form the common N-electrode. In the configuration of the image display element 200c, as illustrated in FIG. 11, the metal reflective layer 20W is also used as the N-electrode (second electrode) 20N.

That is, the micro light emitting element 100c includes the N-electrode 20N which is electrically connected to the metal reflective layer 20W, on a surface on an opposite side of the light emitting surface side. The P-electrode 20P and the N-electrode 20N for supplying a current to the micro light emitting elements 100c are arranged in a two-dimensional array shape on the surface of the pixel region 1 in the driving circuit substrate 50c.

The driving circuit substrate 50c includes the P-drive electrode 51 (connected to the P-electrode 20P of each micro light emitting element 100c through the bonding material 70) and the N-drive electrode 52 (connected to the metal reflective layer 20W also used as the N-electrode 20N, through the bonding material 70) in the pixel region 1. In FIG. 11, N-electrodes 20N of two micro light emitting elements 100c adjacent to each other are connected to one N-drive electrode 52.

(Manufacturing Flow of Image Display Element 200c)

FIGS. 12(a) to 12(f) are schematic sectional views illustrating a manufacturing flow of the image display element 200c according to Embodiment 4 of the present invention. In descriptions of the manufacturing flow of the image display element 200c in FIGS. 12(a) to 12(d), the transparent insulating film 17 side is set to be upper, and the growth substrate 9 side is set to be lower. In descriptions of the manufacturing flow of the image display element 200c in FIGS. 12(e) and 12(f), the growth substrate 9 side is set to be upper, and the driving circuit substrate 50c side is set to be lower.

In the manufacturing flow of the image display element 200c, the state of the image display element 200c (illustrated in FIG. 12(a)) is considered to be after the processes illustrated in FIGS. 2(a) to 2(d) are performed. In this state, as illustrated in FIG. 12(b), the P-contact hole 19P is formed on the P-side metal layer 10. A bottom opening 19BN of the N-side layer 11 is formed at a portion of the N-side layer side surface 11S.

In FIG. 12(b), a portion of the transparent insulating film 17 provided on the N-side layer side surface 11S is removed to expose the N-side layer side surface 11S for the two adjacent N-side layer side surfaces 11S facing to each other. In the configuration of the image display element 200c, the N-side layer side surface 11S is inclined. Thus, it is possible to etch the transparent insulating film 17 even by a dry etching method.

Accordingly, it is possible to adjust dimensions of the bottom opening 19BN with high precision, and to reduce the removed portion of the transparent insulating film 17 to be the necessary minimum. In a case where the N-side layer side surface 11S has no taper and is perpendicular to the growth substrate 9, wet etching has to be used, and controllability of dimensions in pattern is low.

Then, after the P-contact hole 19P and the bottom opening 19BN are formed, as illustrated in FIG. 12(c), the metal layer 20 is deposited to cover exposed portions of the growth substrate 9, the P-side metal layer 10, the N-side layer 11, and the transparent insulating film 17. Further, as illustrated in FIG. 12(d), the metal layer 20 is processed with a photolithographic method and an anisotropic dry etching method. Since the metal layer 20 is processed in this manner, the P-electrode 20P is formed on the P-contact hole 19P, and the metal reflective layer 20W is formed to cover a portion of the transparent insulating film 17 on the slope 16S and the N-side layer side surface 11S. The metal reflective layer 20W is in electrical contact with the N-side layer 11 in the bottom opening 19BN.

After the metal layer 20 is processed, as illustrated in FIG. 12(e), the micro light emitting element 100c and the driving circuit substrate 50c are stuck to each other with the bonding material 70. After the micro light emitting element 100c and the driving circuit substrate 50c are stuck to each other, as illustrated in FIG. 12(f), the growth substrate 9 is removed. Then, similar to other embodiments, a space between micro light emitting elements 100c may be filled with a filling material.

In the configuration of the image display element 200c, a portion at which the transparent insulating film 17 is not provided between the metal reflective layer 20W and the N-side layer side surface 11S is provided among portions of the N-side layer side surface 11S. That is, the metal reflective layer 20W is electrically connected to the N-side layer 11, and more specifically, is electrically connected to at least a portion of the N-side layer side surface 11S.

When a structure obtained by removing the transparent insulating film 17 on an entire surface of one of four the N-side layer side surfaces 11S is simulated, the decrease rate of the light extraction efficiency is equal to or less than 3% in comparison to a case where the entire surface of the N-side layer side surface 11S is covered by the transparent insulating film 17. Thus, the light extraction efficiency by the configuration of the image display element 200c has an advantage over the structure in the related art.

As described above, similar to Embodiment 1, it is also possible to improve the light extraction efficiency and to prevent the occurrence of light leakage between the micro light emitting elements 100c adjacent to each other. Furthermore the configuration of the image display element 200c has an additional advantage in that it is not necessary to form the common N-electrode 40 after the micro light emitting element 100c and the driving circuit substrate 50c are stuck to each other, and the growth substrate 9 is removed.

Embodiment 5

(Configuration of Image Display Element 200d)

Still another embodiment of the present invention will be described below with reference to FIGS. 13 to 15. For easy description, members having the same functions as the members described in the above embodiment are denoted by the same reference signs, and repetitive descriptions thereof will not be made. An image display element 200d in Embodiment 5 is different from the image display element 200c in Embodiment 4 in that the transparent insulating film 17 is disposed only for the slope 16S among the slope 16S and the N-side layer side surface 11S.

In addition, the image display element 200d is different from the image display element 200c in that the metal reflective layer 20W (N-electrode 20N) of one micro light emitting element 100c is connected to one N-drive electrode 52. The image display element 200d is the same as the image display element 200c except for the above points.

Thus, since the N-side layer side surface 11S is covered by the metal reflective layer 20W, it is possible to prevent the occurrence of optical crosstalk. With the inclination of the slope 16S and the N-side layer side surface 11S, it is possible to realize light extraction efficiency higher than that in the rectangular parallelepiped structure. For example, in comparison to the light extraction efficiency of 17.9% in the rectangular parallelepiped structure shown in Table 2, in the configuration of the image display element 200d, it is possible to realize the light extraction efficiency of 67.8% being about 3.8 times the light extraction efficiency in the rectangular parallelepiped structure. Further, manufacturing of the image display element 200d is easier than manufacturing of the image display element 200c in Embodiment 4.

FIG. 13 is a schematic sectional view of the pixel region 1 in the image display element 200d according to Embodiment 5 of the present invention. As illustrated in FIG. 13, a micro light emitting element 100d includes the P-electrode 20P and the N-electrode 20N on the lower surface thereof. A driving circuit substrate 50d includes the P-drive electrode 51 and the N-drive electrode 52 on the micro light emitting element 100d side. The P-drive electrode 51 and the N-drive electrode 52 have a relation with the P-electrode 20P and the N-electrode 20N in one-to-one correspondence. Similar to the image display element 200c, the configuration of the image display element 200d has an additional advantage in that, it is not necessary to form the common N-electrode after the micro light emitting element 100d is stuck to the driving circuit substrate 50d, and the growth substrate 9 is removed.

(Manufacturing Flow of Image Display Element 200d)

FIGS. 14(a) to 14(e) are schematic sectional views illustrating the manufacturing flow of the image display element 200d according to Embodiment 5 of the present invention. In descriptions of the manufacturing flow of the image display element 200d in FIGS. 14(a) to 14(e), the transparent insulating film 17 side is set to be upper, and the growth substrate 9 side is set to be lower. In the manufacturing flow of the image display element 200d, after the separation trench 15 is formed by performing the processes in FIGS. 2(a) and 2(b), as illustrated in FIG. 14(a), the transparent insulating film 17 is deposited to cover exposed portions of the N-side layer 11, the light emission layer 12, the P-side layer 13, and the P-side metal layer 10.

After the transparent insulating film 17 is deposited, as illustrated in FIG. 14(b), the isolation trench 18 is formed by etching the transparent insulating film 17 and the N-side layer 11 on the bottom of the separation trench 15. Preferably, the isolation trench 18 reaches the growth substrate 9 to separately divide micro light emitting elements 100d. The surface of the N-side layer 11, which is exposed at this stage is the N-side layer side surface 11S. It is necessary that the inclined angle of the isolation trench 18, that is, the inclined angle θb of the N-side layer side surface 11S is about 80°, similar to FIG. 2(c).

After the isolation trench 18 is formed, as illustrated in FIG. 14(c), the P-contact hole 19P is formed on the P-side metal layer 10. In a process of forming the P-contact hole 19P, it is not necessary to form the bottom opening in the transparent insulating film 17 on the N-side layer side surface 11S as in FIG. 12(b) in Embodiment 4. Thus, manufacturing of the image display element 200d is easier than manufacturing of the image display element 200c.

After the P-contact hole 19P is formed, as illustrated in FIG. 14(d), the metal layer 20 is deposited to cover exposed portions of the growth substrate 9, the P-side metal layer 10, the N-side layer 11, and the transparent insulating film 17. The metal layer 20 is in electrical contact with the P-side metal layer 10 in the P-contact hole 19P and is in electrical contact with the N-side layer 11 on the N-side layer side surface 11S.

Further, as illustrated in FIG. 14(e), the metal layer 20 around a portion as the P-electrode 20P is removed, and thus the metal layer 20 is divided into the P-electrode 20P and the metal reflective layer 20W. The metal reflective layer 20W is also used as the N-electrode 20N. In this manner, each micro light emitting element 100d includes the P-electrode 20P and the N-electrode 20N. The subsequent processes will be omitted because of being similar to those for the image display element 200c in Embodiment 4. In FIG. 14(e), the metal layer 20 on the growth substrate 9 is also removed, but the metal portion can be removed later at the growth substrate removal of FIGS. 12(e) and (f).

Figure 15:
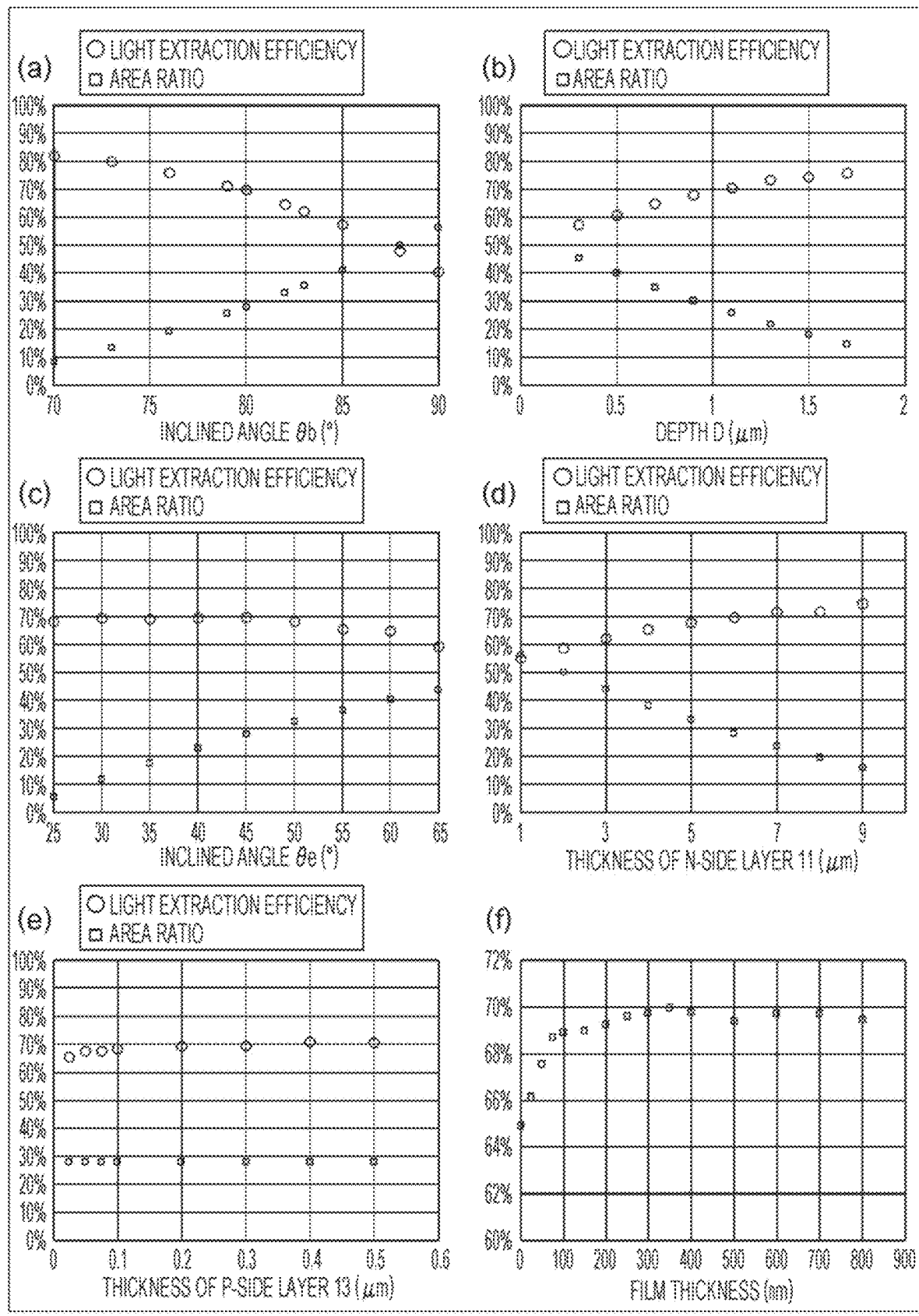
FIG. 15(a) to 15(f) are diagrams illustrating simulation results of dependency of the light extraction efficiency on the dimensions and the angles of each unit in the image display element illustrated in FIG. 13.

FIG. 15 illustrates results obtained by examining the change of the light extraction efficiency to the dimensions and the angles of each unit in the micro light emitting element 100d with the simulation described in Embodiment 1. FIGS. 15(a) to 15(e) are diagrams illustrating simulation results of dependency of the light extraction efficiency on dimensions and angles of each unit in the image display element 200d illustrated in FIG. 13. FIGS. 15(a) to 15(f) also illustrate ratios (area ratio) of the area of the light emission layer 12 to the area of the light emitting surface (upper surface of the N-side layer 11). In FIGS. 15(a) to 15(e), a vertical axis indicates the light extraction efficiency or the area ratio.

In all cases in FIGS. 15(a) to 15(f), so long as particular statements are not made, the size of the upper surface of the N-side layer 11 is 8 μm×8 μm, the thickness of the N-side layer 11 is 6 μm, and the thickness of the P-side layer 13 is 0.2 μm. In addition, the inclined angle θe of the slope 16S is 45°, the depth D at the portion occupied by the N-side layer 11 in the slope 16S is 1 μm, and the inclined angle θb of the N-side layer side surface 11S is 800. Further, the film thickness of the transparent insulating film 17 is 400 nm.

FIG. 15(a) illustrates dependency of the light extraction efficiency on the inclined angle θb of the N-side layer side surface 11S. In FIG. 15(a), a horizontal axis indicates the inclined angle θb. As illustrated in FIG. 15(a), as the inclined angle θb of the N-side layer side surface 11S becomes smaller, the light extraction efficiency is improved. In a case where the inclined angle θb is equal to or less than 900, the light extraction efficiency is equal to or larger than 40%. Thus, it is possible to realize the light extraction efficiency being two times the light extraction efficiency of 17.9% in the rectangular parallelepiped structure. Further, in a case where the inclined angle θb is equal to or less than 830, it is possible to realize the light extraction efficiency of 60% or more.

FIG. 15(b) illustrates dependency of the light extraction efficiency on the depth D at the portion occupied by the N-side layer 11 in the slope 16S. In FIG. 15(b), a horizontal axis indicates the depth D. As illustrated in FIG. 15(b), as the depth D increases, the light extraction efficiency is improved. Since the depth D is equal to or greater than 0.5 µm, it is possible to realize the light extraction efficiency of 60% or more.

FIG. 15(c) illustrates dependency of the light extraction efficiency on the inclined angle θe of the slope 16S. In FIG. 15(c), a horizontal axis indicates the inclined angle θe. In order to improve the light extraction efficiency, it is preferable that the inclined angle θe is equal to or less than 600. Thus, it is possible to realize the light extraction efficiency of 60% or more. Further preferably, the inclined angle θe is equal to or less than 500.

FIG. 15(d) illustrates dependency of the light extraction efficiency on the thickness of the N-side layer 11. The thickness is a thickness in the vertical direction (direction from the upper surface of the micro light emitting element 100d toward the lower surface). In FIG. 15(d), a horizontal axis indicates the thickness of the N-side layer 11. As the thickness of the N-side layer 11 becomes thicker, the light extraction efficiency is improved. It is preferable that the thickness of the N-side layer 11 is equal to or more than 3 µm, and thus it is possible to realize the light extraction efficiency of 60% or more.

FIG. 15(e) illustrates dependency of the light extraction efficiency on the thickness of the P-side layer 13. In FIG. 15(e), a horizontal axis indicates the thickness of the P-side layer 13. As the thickness of the P-side layer 13 becomes thicker, the light extraction efficiency is improved. However, the influence is smaller than those of other parameters illustrated in FIGS. 15(a) to 15(d).

FIG. 15(f) illustrates dependency of the light extraction efficiency on the film thickness of the transparent insulating film 17. In FIG. 15(f), a vertical axis and a horizontal axis indicate the light extraction efficiency and film thickness of the transparent insulating film 17, respectively. As the film thickness of the transparent insulating film 17 becomes thicker, the light extraction efficiency is improved. However, a change at the film thickness of 400 nm or more is small. Thus, it is most preferable that the film thickness of the transparent insulating film 17 is equal to or more than 400 nm. The film thickness of the transparent insulating film 17 may be equal to or more than at least 75 nm such that the decrease of the light extraction efficiency is within 2% even in a case of the film thickness being 75 nm or more, in comparison to a case of the film thickness being 400 nm or more.

As illustrated in FIGS. 15(a) to 15(f), in the configuration of the image display element 200d, it is possible to realize the light extraction efficiency of at least 40% or more. This is the light extraction efficiency of 2.2 times the light extraction efficiency of 17.9% in the rectangular parallelepiped structure shown in Table 2 and exhibits very large improvement of the light extraction efficiency. Further, in the configuration of the image display element 200d, it is possible to realize the light extraction efficiency of 60% or more by appropriately selecting the structure of the micro light emitting element 100d.

Embodiment 6

(Configuration of Image Display Element 200e)

Figure 16:
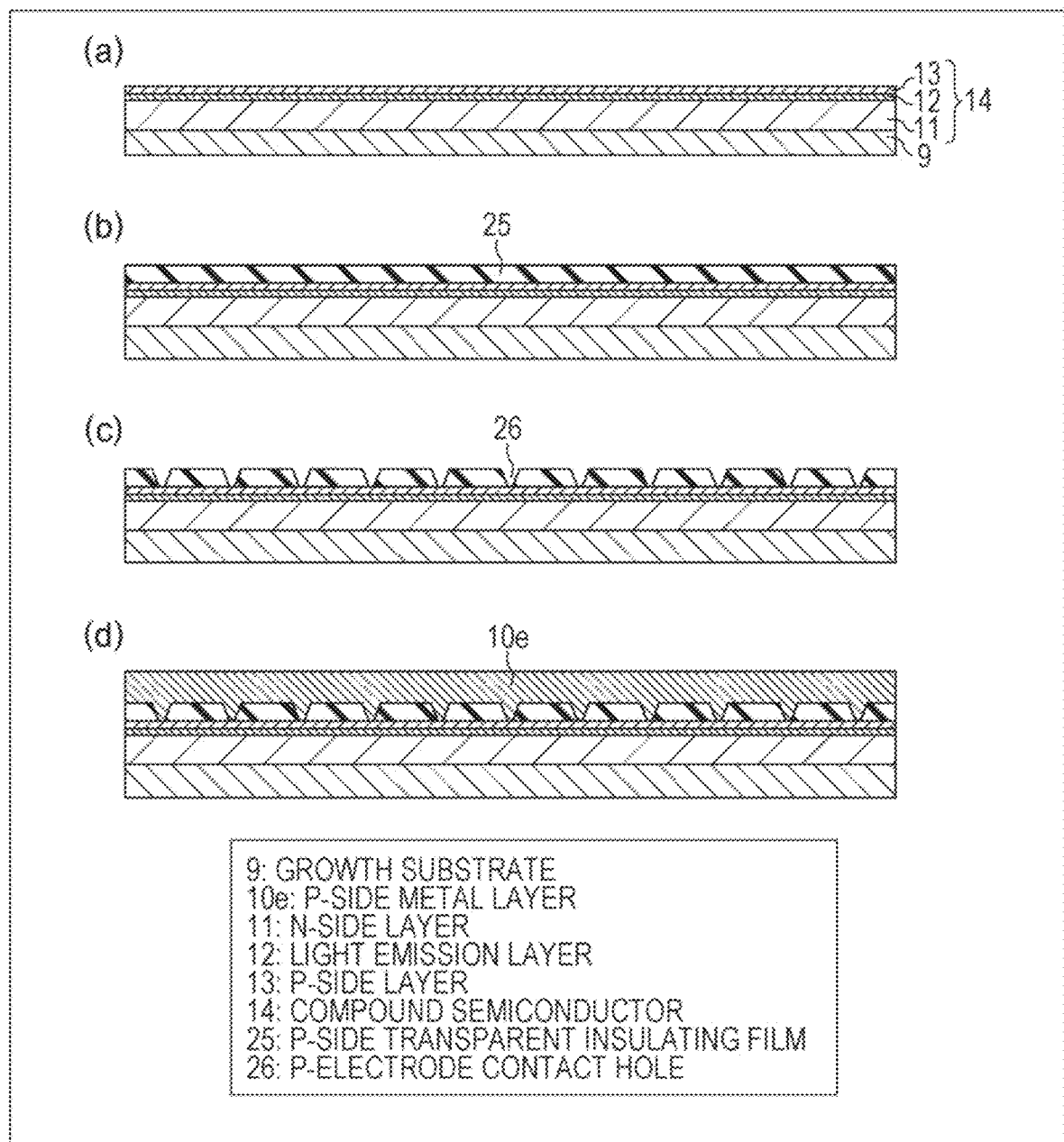
FIGS. 16(a) to 16(d) are schematic sectional views illustrating a manufacturing flow of an image display element according to Embodiment 6 of the present invention.

Still another embodiment of the present invention will be described below with reference to FIG. 16. For easy description, members having the same functions as the members described in the above embodiment are denoted by the same reference signs, and repetitive descriptions thereof will not be made. An image display element 200e in Embodiment 6 is different from the image display element 200 in Embodiment 1 in that the P-side metal layer 10 is changed to a P-side metal layer (first metal film) 10e. The image display element 200e is the same as the image display element 200 except for the above points.

In the configuration of the image display element 200e, a P-side transparent insulation film (P-side transparent insulation layer) (third transparent insulating film) 25 is disposed between the P-side layer 13 and the P-side metal layer 10e. In addition, a P-side metal layer contact hole 26 is formed in the P-side transparent insulation film 25. Thus, the P-side layer 13 and the P-side metal layer 10e are electrically connected to each other.

As clear from the above descriptions, since the transparent insulating film 17 is disposed between the metal reflective layer 20W and the compound semiconductor 14, it is possible to improve reflectivity and to improve the light extraction efficiency. However, if the P-side layer 13 and the P-side metal layer 10e are electrically connected to each other, it is not possible to dispose a transparent insulating film on the entire surface of the P-side layer 13. Therefore, the P-side metal layer contact hole 26 is formed to partially connect the P-side layer 13 and the P-side metal layer 10e to each other, and thus it is possible to further improve the light extraction efficiency while the P-side layer 13 and the P-side metal layer 10e are electrically connected.

(Manufacturing Flow of Image Display Element 200e)

FIGS. 16(a) to 16(d) are schematic sectional views illustrating a manufacturing flow of the image display element 200e according to Embodiment 6 of the present invention. In descriptions of the manufacturing flow of the image display element 200e, the P-side layer 13 side is set to be upper, and the growth substrate 9 side is set to be lower. In the manufacturing flow of the image display element 200e, only a process of forming the P-side metal layer 10e is explained here. Description about the processes other than the process of forming the P-side metal layer 10e will be omitted, because processes described in other embodiments can be applied.

FIG. 16(a) illustrates a state where the compound semiconductor 14 is deposited on the growth substrate 9. The sheet resistance of the P-side layer 13 in the image display element 200e is preferably as low as possible. The thickness of the P-side layer 13 in the image display element 200e may be thicker than the thickness of the P-side layer 13 described in Embodiments 1 to 5.

Then, as illustrated in FIG. 16(b), the P-side transparent insulation film 25 is deposited on the P-side layer 13. The material and the thickness of the P-side transparent insulation film 25 may be the same as the material and the thickness of the transparent insulating film 17. After the P-side transparent insulation film 25 is deposited, as illustrated in FIG. 16(c), the P-side metal layer contact hole 26 is formed in the upper surface of the P-side transparent insulation film 25. The P-side metal layer contact hole 26 extends from the P-side transparent insulation film 25 to the P-side layer 13.

Preferably, a ratio of an area occupied by the P-side metal layer contact hole 26 in the upper surface of the P-side transparent insulation film 25 is small. For example, if P-side metal layer contact holes 26 having a diameter of 0.1 μm are formed at a pitch of 1 μm, the ratio of the area occupied by the P-side metal layer contact holes 26 in the upper surface of the P-side transparent insulation film 25 is about 1/100. In this case, even if the P-side metal layer contact hole 26 is filled with a metal layer, it is possible to sufficiently maintain the light extraction efficiency by the P-side transparent insulation film 25.

The ratio of the area occupied by the P-side metal layer contact holes 26 in the upper surface of the P-side transparent insulation film 25 is smaller, then the effect of improving the light extraction efficiency is larger. However, for example, even if the P-side metal layer contact hole 26 occupies about half of an area of the upper surface of the P-side transparent insulation film 25, it is possible to sufficiently maintain improvement effect at the light extraction efficiency.

After the P-side metal layer contact hole 26 is formed, as illustrated in FIG. 16(d), the P-side metal layer 10e is deposited to cover exposed portions of the P-side transparent insulation film 25 and the P-side layer 13. At this time, the P-side metal layer contact hole 26 is filled with a metal material such as palladium (Pd), which is easy to obtain an ohmic contact with the P-side layer 13, and a metal layer of silver or aluminum having high visible light reflectivity may be deposited on the metal material.

Regarding the structure and the manufacturing method of the micro light emitting element and the image display element 200e to apply this form, a combination with any form of Embodiments 1 to 5 may be made. Thus, descriptions thereof will be omitted. If any form of Embodiments 1 to 5 is combined with Embodiment 6, it is possible to further enhance the effect of improving the light extraction efficiency, which is provided in any form of Embodiments 1 to 5. And also the P-side metal layer 10e prevents downward emission of light like the P-side metal layer 10 of Embodiments 1.

In the following Table 3, a case where the P-side transparent insulation film is added to Embodiment 1 structure is compared with a case of Embodiment 1 without the P-side transparent insulation film. With the configuration obtained by combining the configuration in Embodiment 6 to the configuration in Embodiment 1, it is possible to reduce the absorption amount of the lower surface and to improve the light extraction efficiency to be about 4%. Table 3 shows simulation results of the light extraction efficiency.

TABLE 3

| P-side transparent insulation film | None | Provided |
|---|---|---|
| Light extraction efficiency | 80.7% | 84.9% |
| Side surface absorption | 8.8% | 9.2% |
| Bottom surface absorption | 6.0% | 0.8% |
| Internal absorption | 4.5% | 5.1% |
| Average internal reflection number | 25.4 | 26.3 |

If any form of Embodiments 1 to 5 is combined with Embodiment 6, it is possible to further enhance the effect of improving the light extraction efficiency, which is provided in any form of Embodiments 1 to 5. And it is also possible to prevent the occurrence of light leakage between the micro light emitting elements 100e adjacent to each other.

Embodiment 7

(Configuration of Image Display Element 200f)

Still another embodiment of the present invention will be described below with reference to FIG. 17. For easy description, members having the same functions as the members described in the above embodiment are denoted by the same reference signs, and repetitive descriptions thereof will not be made. An image display element 200f in Embodiment 7 is different from the image display element 200e in Embodiment 6 in view of a method of electrically connecting the P-side layer 13 and a P-side metal layer (first metal film) 10f. The image display element 200f is the same as the image display element 200e except for the electrical connection method.

In the configuration of the image display element 200f, the P-side layer 13 is deposited to be thicker than the P-side layer 13 in the image display element 200e. Anisotropic etching is performed on the P-side layer 13 to form a pillar shape. Thus, a P-side layer pillar 27 is formed. A P-side transparent insulation film (second transparent insulating film) 25f buries the P-side layer pillars 27, and the P-side metal layer 10f being a metal layer is deposited on the P-side transparent insulation film 25f.

(Manufacturing Flow of Image Display Element 200f)

FIGS. 17(a) to 17(d) are schematic sectional views illustrating a manufacturing flow of the image display element 200f according to Embodiment 7 of the present invention. In descriptions of the manufacturing flow of the image display element 200f, the P-side layer 13 side is set to be upper, and the growth substrate 9 side is set to be lower. In the manufacturing flow of the image display element 200f, as illustrated in FIG. 17(a), the compound semiconductor 14 is deposited on the growth substrate 9. The thickness of the P-side layer 13 is equal to or more than at least 100 nm.

After the compound semiconductor 14 is deposited, as illustrated in FIG. 17(b), the P-side layer 13 is etched by the photolithographic method and the anisotropic etching method, so as to remain the bottom of the P-side layer 13 and the P-side layer pillar 27. The height of the P-side layer pillar 27 is 25 nm to 1 μm. In plan view from the light emitting surface side, a ratio of the total area for upper surfaces of a plurality of P-side layer pillars 27 to the area of the horizontal surface of the P-side metal layer 10f is preferably small. However, even though the ratio is about 50%, the effect of improving the light extraction efficiency is obtained.

After the P-side layer 13 is etched, as illustrated in FIG. 17(c), the P-side transparent insulation film 25f is deposited between the P-side layer pillars 27, and an upper portion of the P-side layer pillar 27 is exposed. For example, after the P-side transparent insulation film 25f is deposited, the P-side transparent insulation film 25f is polished by the CMP method, and thus it is possible to expose the upper portion of the P-side layer pillar 27.

A metal film may be formed in advance, on the upper surface of the P-side layer pillar 27. For example, metal such as palladium may be deposited on the upper surface of the P-side layer 13, and the P-side layer 13 may be processed to process the metal and to form the P-side layer pillar 27. Thus, the metal can be caused to function as a stopper layer for stopping polishing by the CMP method, and it is possible to realize ohmic contact between the P-side layer 13 and the metal.

Further, without using the photolithographic method, metal nanoparticle may be dispersed and arranged on the upper surface of the P-side layer 13, and the P-side layer 13 may be subjected to anisotropic etching by using the arranged metal nanoparticles as a mask layer. If the metal nanoparticles have a diameter of several tens of nanometers, even though the anisotropic etching is not necessarily performed on the P-side layer 13, it is possible to obtain the effect of improving the light extraction efficiency only by burying the P-side transparent insulation film 25f between the metal nanoparticles. After the P-side transparent insulation film 25f is deposited, as illustrated in FIG. 17(d), the P-side metal layer 10f is deposited on the P-side layer pillar 27 and the P-side transparent insulation film 25f. The P-side metal layer 10f prevents downward emission of light just like the P-side metal layer 10 of Embodiments 1.

Regarding the structure and the manufacturing method of the micro light emitting element and the image display element 200f to apply this form, a combination with any form of Embodiments 1 to 5 may be made. Thus, descriptions thereof will be omitted. If any form of Embodiments 1 to 5 is combined with Embodiment 7, it is possible to further enhance the effect of improving the light extraction efficiency, which is provided in any form of Embodiments 1 to 5. And it is also possible to prevent the occurrence of light leakage between the micro light emitting elements 100f adjacent to each other.

Embodiment 8

(Configuration of Image Display Element 200g)

Still another embodiment of the present invention will be described below with reference to FIG. 18. For easy description, members having the same functions as the members described in the above embodiment are denoted by the same reference signs, and repetitive descriptions thereof will not be made.

An image display element 200g in Embodiment 8 is different from the image display element 200 in Embodiment 1 in that the inclined angle θe of the slope 16S is substantially equal to the inclined angle θb of the N-side layer side surface 11S. The image display element 200g is the same as the image display element 200 except for the above point. Since the inclined angle θe of the slope 16S is substantially equal to the inclined angle θb of the N-side layer side surface 11S, the slope 16S extends to the light emitting surface. At this time, the slope 16S is covered by the metal reflective layer 20W, and the transparent insulating film 17 is disposed between the slope 16S and the metal reflective layer 20W.

FIG. 18(a) is an aerial view of a micro light emitting element having a truncated pyramid type structure according to Embodiment 8 of the present invention. FIG. 18(b) is a diagram illustrating a simulation result of dependency of the light extraction efficiency on the inclined angle. FIG. 18(c) is a diagram illustrating a simulation result of film thickness dependency of the transparent insulating film in the light extraction efficiency.

As illustrated in FIG. 18(a), the shape of a micro light emitting element 100g in the image display element 200g is a truncated pyramid type. In the manufacturing flow of the image display element 200g, an isolation trench may be formed by combining the processes illustrated in FIGS. 2(b) and 2(c) to one process, such that the inclined angle θe is substantially equal to the inclined angle θb.

(Manufacturing Flow of Image Display Element 200g)

In the manufacturing flow of the image display element 200g, processes other than a process of forming the isolation trench are similar to those in the manufacturing flow of the image display element 200 in Embodiment 1. In the manufacturing flow of the image display element 200g, it is possible to reduce the manufacturing flow by one process. Generally, in comparison to the image display element 200, since the inclined angle θb of the N-side layer side surface 11S is small, it is possible to more easily deposit the metal layer 20 on the transparent insulating film 17 deposited on the N-side layer side surface 11S.

In the following Table 4, light emission characteristics of the micro light emitting element having the rectangular parallelepiped structure was compared with light emission characteristics of the micro light emitting element 100g having the truncated pyramid type. In all of a case of the micro light emitting element having the rectangular parallelepiped structure and a case of the micro light emitting element 100g, the size of the upper surface of the N-side layer 11 was 8 m×8 µm, and the same compound semiconductor was used. In the case of the micro light emitting element having the rectangular parallelepiped structure and the case of the micro light emitting element 100g, the constituent materials and the formation processes are the same as each other except for a different shape.

In the case of the micro light emitting element having the rectangular parallelepiped structure, the separation trench and the isolation trench were processed to be inclined as small as possible. In addition, in the case of the micro light emitting element 100g, the side surface of the N-side layer 11, which was formed by the isolation trench 18 was processed and formed such that inclined angles θe and θb were about 80°. In all cases, the transparent resin layer was disposed on the upper surface of the N-side layer 11. In all cases, 10000 pieces of micro light emitting elements in 100 rows×100 columns simultaneously turned on to evaluate the total luminous flux intensity. The current amount per one micro light emitting element 100g is 5 µA. The following Table 4 shows measurement results.

TABLE 4

|  | Rectangular parallelepiped structure | Truncated bent pyramid type structure |
| --- | --- | --- |
| External quantum efficiency | 12% | 32% |
| Area ratio of light emission layer to light emitting surface | 100% | 54% |
| Estimated effective internal quantum efficiency | 66% | 60% |

As shown in Table 4, in the micro light emitting element 100g having the truncated pyramid type, the external quantum efficiency of about 2.7 times that in the micro light emitting element having the simple rectangular parallelepiped structure is obtained. Table 5 shows results obtained by simulating the light extraction efficiency with the lay trace method. Estimated effective internal quantum efficiency shown in Table 4 is an estimated value obtained by being calculated from the external quantum efficiency shown in Table 4 with the light extraction efficiency shown in Table 5. In the micro light emitting element 100g having the truncated pyramid type, the light extraction efficiency of about 3.0 times that in the micro light emitting element having the simple rectangular parallelepiped structure is obtained. Values shown in Table 5 are simulation values.

TABLE 5

|  | Rectangular parallelepiped structure | Truncated bent pyramid type structure |
| --- | --- | --- |
| Light extraction efficiency | 17.9% | 53.7% |
| Side surface absorption | 29.4% | 23.0% |

TABLE 5-continued

| | Rectangular parallelepiped structure | Truncated bent pyramid type structure |
|---|---|---|
| Bottom surface absorption | 29.5% | 12.1% |
| Internal absorption | 23.2% | 11.2% |
| Average internal reflection number | 85.4 | 40.1 |

As illustrated in FIG. 18(b), as the inclined angle θb becomes smaller, the light extraction efficiency is improved. In a case where the inclined angle θb is equal to or less than 82°, it is possible to realize the light extraction efficiency of 48% or more. Further, in a case where the inclined angle θb is equal to or less than 75°, it is possible to realize the light extraction efficiency of 70% or more.

As illustrated in FIG. 18(c), when the film thickness of the transparent insulating film 17 is equal to or more than 75 nm, it is possible to realize the light extraction efficiency of 48% or more. In FIG. 18(c), a vertical axis indicates the light extraction efficiency, and a horizontal axis indicates the film thickness of the transparent insulating film 17. If the film thickness of the transparent insulating film is equal to or more than 400 nm, it is possible to realize the stable light extraction efficiency of about 54%. Thus, the film thickness of the transparent insulating film 17 is preferably equal to or more than 400 nm.

Regarding electrode arrangement in the micro light emitting element 100g, similar to Embodiment 1 or Embodiment 2, a configuration in which the common N-electrode (light emitting surface-side electrode) 40 is disposed on the light emitting surface side may be made. Similar to Embodiment 4 or Embodiment 5, a configuration in which the metal reflective layer 20W is brought into contact with the N-side layer 11 and the N-electrode 20N is disposed on the surface on the opposite side of the light emitting surface side may be made.

As described above, similar to Embodiment 1, it is also possible to improve the light extraction efficiency and to prevent the occurrence of light leakage between the micro light emitting elements 100g adjacent to each other.

Embodiment 9

(Configuration of Image Display Element 200h)

Figure 20:
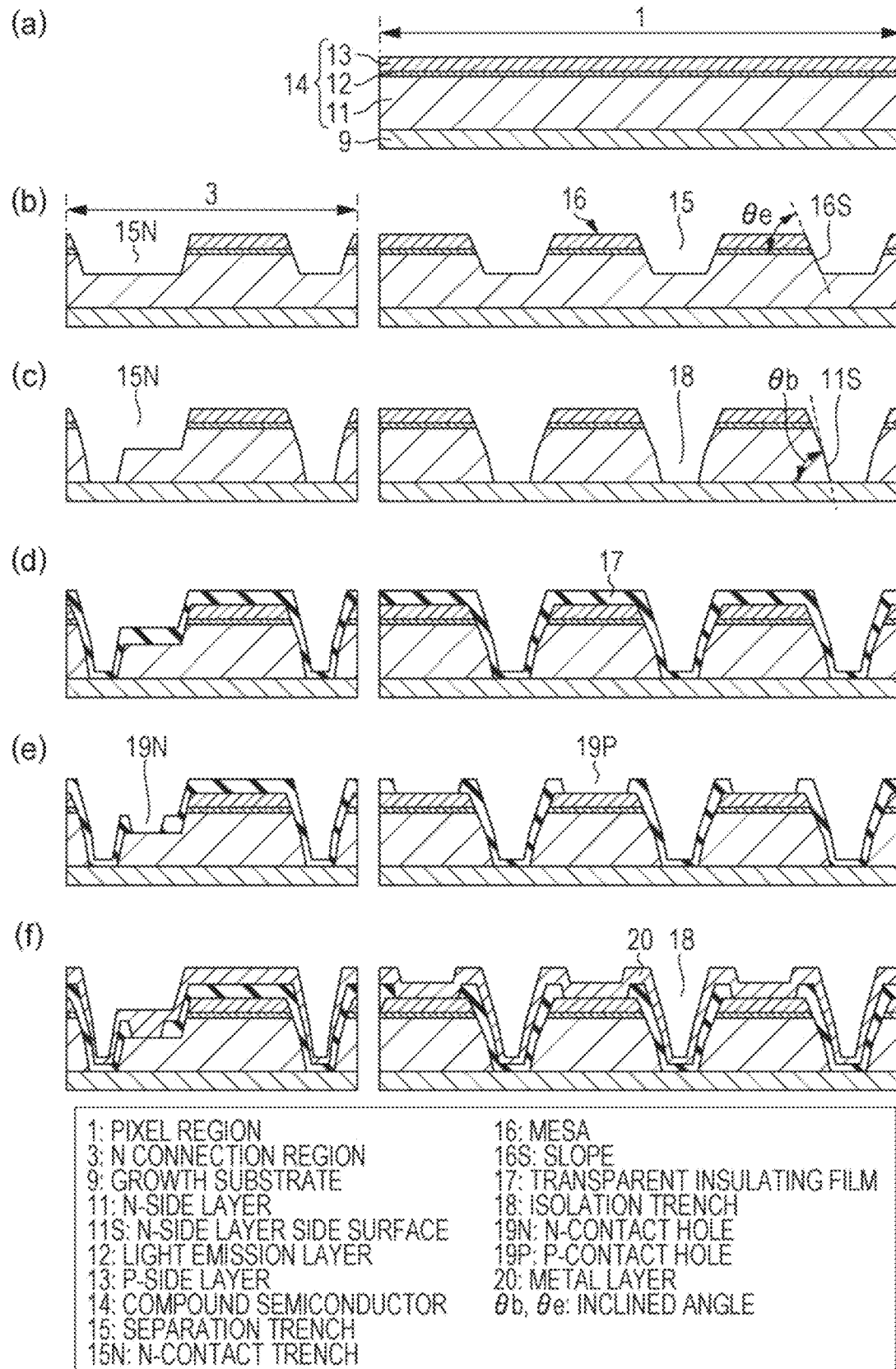
FIGS. 20(a) to 20(f) are schematic sectional views illustrating a manufacturing flow of a micro light emitting element according to Embodiment 9 of the present invention.
Figure 21:
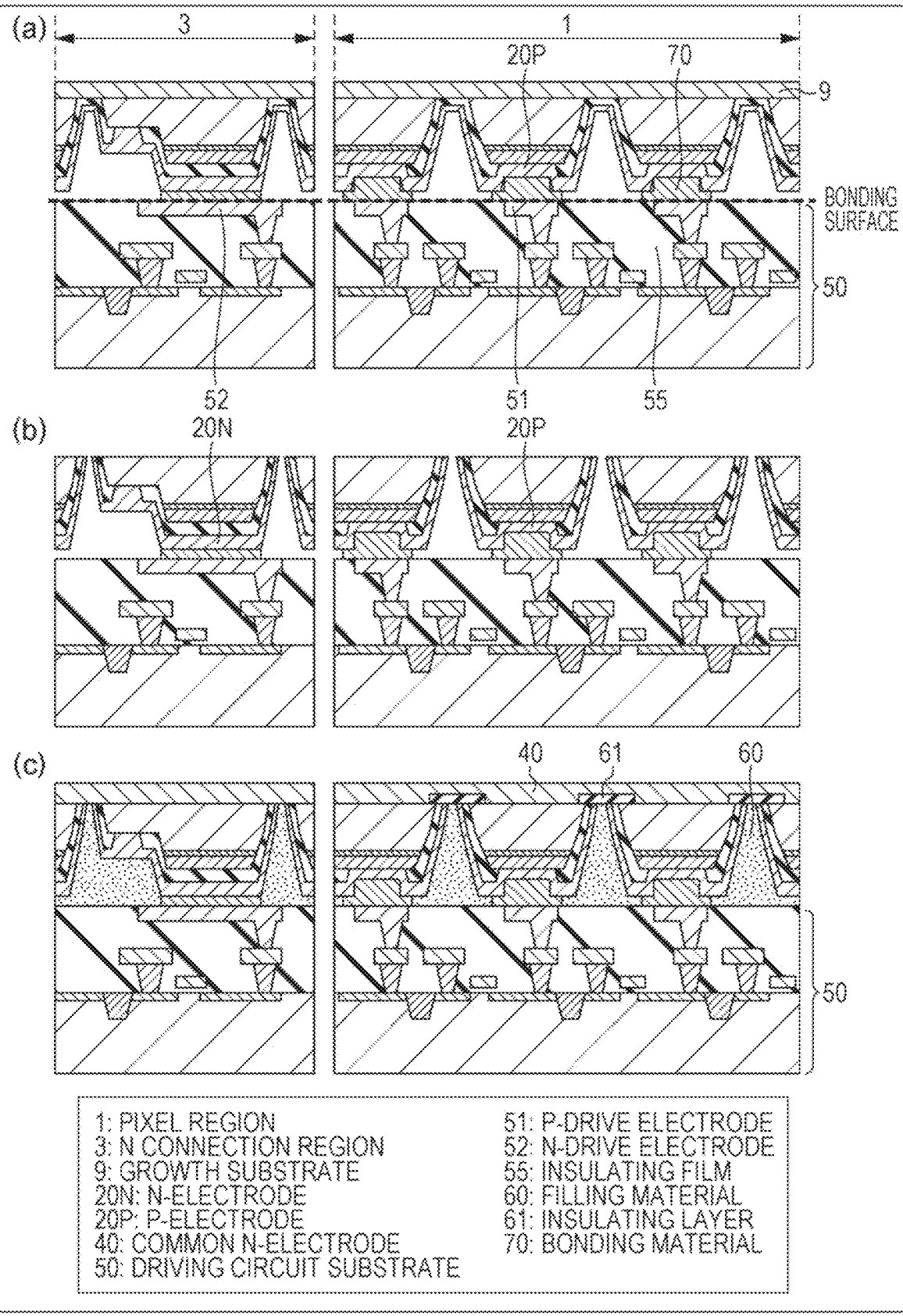
FIGS. 21(a) to 21(c) are schematic sectional views illustrating a manufacturing flow of the image display element according to Embodiment 9 of the present invention.

Still another embodiment of the present invention will be described below with reference to FIGS. 19 to 21. For easy description, members having the same functions as the members described in the above embodiment are denoted by the same reference signs, and repetitive descriptions thereof will not be made. An image display element 200h in Embodiment 9 is different from the image display element 200 in Embodiment 1 in that only a single electrode layer is provided in addition to the common N-electrode 40. The image display element 200h is the same as the image display element 200 except for the above point.

FIG. 19 is a schematic sectional view of the image display element 200h according to Embodiment 9 of the present invention. As illustrated in FIG. 19, a micro light emitting element 100h in the image display element 200h has a structure in which the P-electrode (first metal film) 20P and the metal reflective layer (second metal film) 20W are joined to each other. That is, the metal reflective layer 20W is also used as the P-electrode 20P. In Embodiments 1 to 5, the first metal film and the second metal film are metal films separate from each other and are not in contact with each other. However, in this embodiment, the first metal film and the second metal film are joined to each other to be continuous, and are integrally formed.

The P-electrode 20P is directly in contact with the P-side layer 13. The P-electrode 20P covers the surface of the micro light emitting element 100h on the P-side layer 13 side, and covers the slope 16S and the N-side layer side surface 11S through the transparent insulating film 17. Thus, it is possible to prevent the occurrence of light leakage between micro light emitting elements 100h adjacent to each other and to reduce the occurrence of optical crosstalk. In addition, since the transparent insulating film 17 is disposed between the P-electrode 20P, and the slope 16S and the N-side layer side surface 11S, it is possible to realize high light extraction efficiency.

The micro light emitting element 100h includes an insulating layer 61 for preventing electrical short circuit between the P-electrode 20P and the common N-electrode 40. In order to reduce the occurrence of optical crosstalk, the P-electrode 20P preferably covers the N-side layer side surface 11S up to the upper end of the N-side layer side surface. However, if the insulating layer 61 is not provided, a short circuit between the P-electrode 20P and the common N-electrode 40 occurs at the upper end portion of the micro light emitting element 100h.

Thus, it is necessary to provide the insulating layer 61 for covering the upper end portion of the micro light emitting element 100h, in the pixel region 1. In the N connection region 3, since a contact between the N-electrode 20N and the common N-electrode 40 is preferable, it is not necessary to provide the insulating layer 61. A contact portion between the N-electrode 20N and the common N-electrode 40 may be a current path in a dummy connection element 101h in the N connection region 3. Similar to the micro light emitting element 100 in Embodiment 1, a current may flow between the N-electrode 20N and the common N-electrode 40 through the N-side layer 11.

(Manufacturing Flow of Micro Light Emitting Element 100h)

FIGS. 20(a) to 20(f) are schematic sectional views illustrating the manufacturing flow of the micro light emitting element 100h according to Embodiment 9 of the present invention. The manufacturing flow of the micro light emitting element 100h is similar to the manufacturing flow of the micro light emitting element 100 in Embodiment 1 except that the P-side metal layer 10 is not deposited. Only differences between the manufacturing flow of the micro light emitting element 100h and the manufacturing flow of the micro light emitting element 100 will be described below.

In the configuration of the micro light emitting element 100h, in comparison to the configuration of the micro light emitting element 100, the P-contact hole 19P is preferably formed as large as possible such that the P-side layer 13 having high sheet resistance is directly in contact with the P-electrode 20P. In the configuration of the micro light emitting element 100h, since the P-electrode 20P and the metal reflective layer 20W are integrated, it is not necessary to perform pattern processing on the metal layer 20 in the pixel region 1 and the N connection region 3. Since it is not necessary to deposit the P-side metal layer 10 and to perform pattern processing on the metal layer 20, the manufacturing flow of the micro light emitting element 100 becomes simpler than the manufacturing flow of the micro light emitting element 100, and it is possible to reduce manufacturing cost.

(Manufacturing Flow of Image Display Element 200h)

FIGS. 21(a) to 21(c) are schematic sectional views illustrating the manufacturing flow of the image display element 200h according to Embodiment 9 of the present invention. In descriptions of the manufacturing flow of the image display element 200h, the growth substrate 9 side is set to be upper, and the driving circuit substrate 50 side is set to be lower. As illustrated in FIG. 21(a), a process of connecting the P-electrode 20P in the micro light emitting element 100h to the P-drive electrode 51 in the driving circuit substrate 50 with the bonding material 70 is similar to the process illustrated in FIG. 3(b).

As illustrated in FIG. 21(b), a process of removing the growth substrate 9 is also similar to the process illustrated in FIG. 3(c). In the manufacturing flow of the image display element 200h, with the process of removing the growth substrate 9, the metal layer 20 is divided for each micro light emitting element 100h, and the P-electrode 20P is formed. Similarly, in the N connection region 3, the N-electrode 20N is formed by the process of removing the growth substrate 9.

After the P-electrode 20P and the N-electrode 20N are formed, similar to the processes illustrated in FIGS. 3(d) and 3(e), a space between micro light emitting elements 100h is filled with the filling material 60 to form the common N-electrode 40. Generally, at a stage at which coating with the filling material 60 is performed, a resin layer remains on the upper surface of the micro light emitting element 100h by the filling material 60. Thus, it is necessary to remove the resin layer remaining on the upper surface of the micro light emitting element 100h. In a process of removing the resin layer, the resin layer between the micro light emitting elements 100h remains, and thus it is possible to form the insulating layer 61 between the micro light emitting elements 100h. As described above, the material of the insulating layer 61 may be the same as or different from the material of the filling material 60.

In a process illustrated in FIG. 20(f), after the metal layer 20 is deposited, a process of removing the metal layer 20 at a predetermined depth from the bottom of the isolation trench 18 may be added. For example, the bottom of the isolation trench 18 in the pixel region 1 is opened by the photolithographic method, and the metal layer 20 is etched by the dry etching method or the wet etching method.

In this case, in a process illustrated in FIG. 21(b), the position of the upper end portion of the P-electrode 20P may be located to be lower than the upper surface of the N-side layer 11. As a result, the P-electrode 20P is not in contact with the common N-electrode 40, and thus it is possible to omit formation of the insulating layer 61. Compared to a case where the P-electrode 20P does not cover the entirety of the N-side layer side surface 11S, it is possible to sufficiently realize an effect of significantly preventing the occurrence of light leakage. As described above, the configuration of the image display element 200h has an additional advantage in that, since the micro light emitting element 100h is configured by a single metal film (electrode layer), the manufacturing flow is simplified, and the manufacturing cost is reduced.

Embodiment 10

(Configuration of Image Display Element 200i)

Figure 22:
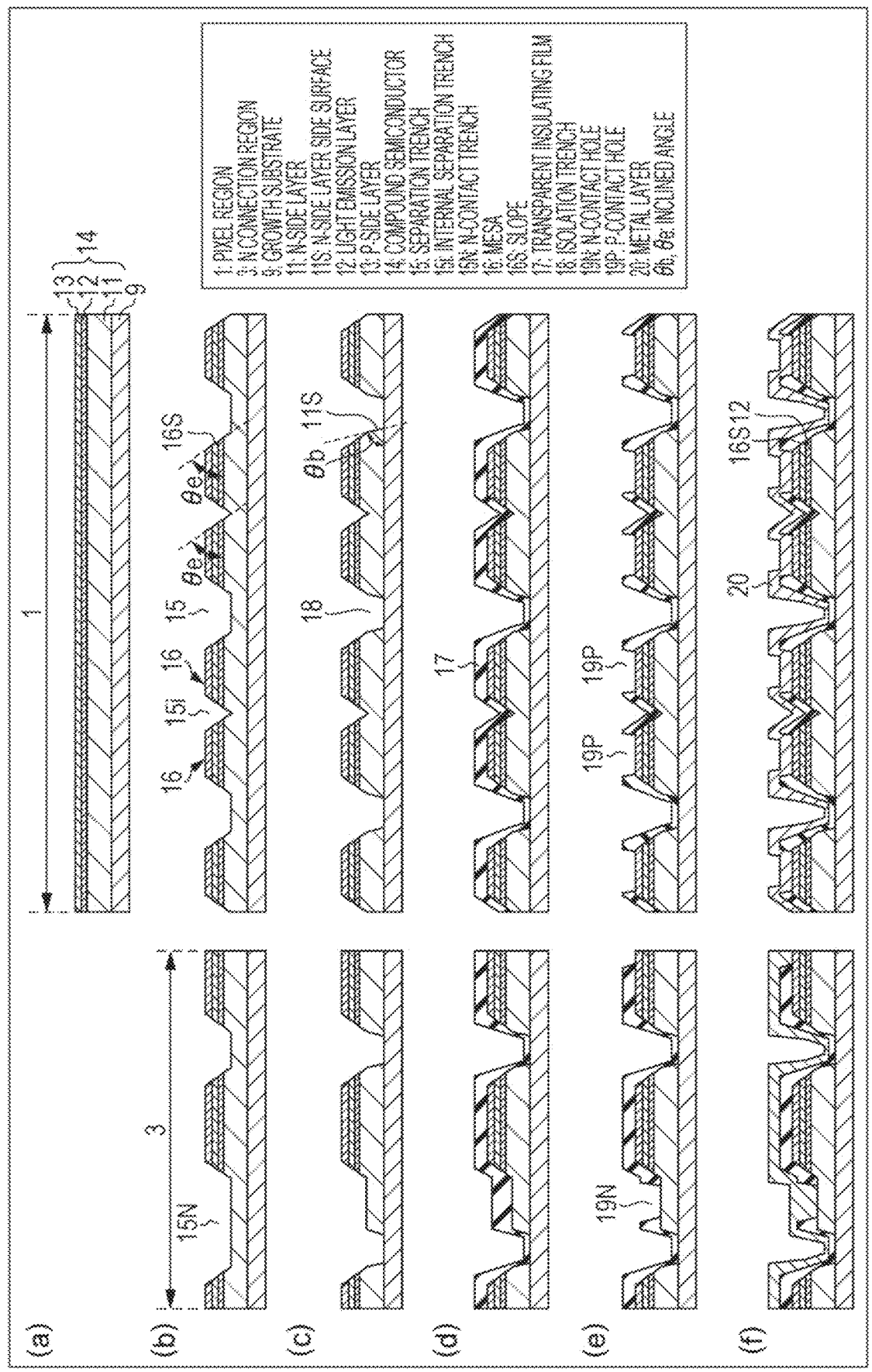
FIGS. 22(a) to 22(f) are schematic sectional views illustrating a manufacturing flow of a micro light emitting element according to Embodiment 10 of the present invention.

Still another embodiment of the present invention will be described below with reference to FIG. 22. For easy description, members having the same functions as the members described in the above embodiment are denoted by the same reference signs, and repetitive descriptions thereof will not be made. An image display element 200i in Embodiment 10 is different from the image display element 200 in Embodiment 1 in that one micro light emitting element 100i includes a plurality of mesas 16. The image display element 200i is the same as the image display element 200 except for the above point.

(Manufacturing Flow of Micro Light Emitting Element 100i)

FIGS. 22(a) to 22(f) are schematic sectional views illustrating the manufacturing flow of a micro light emitting element 100i according to Embodiment 10 of the present invention. In descriptions of the manufacturing flow of the image display element 200i, the P-side layer 13 side is set to be upper, and the growth substrate 9 side is set to be lower. The micro light emitting element 100i will be described with reference to FIG. 22. Here, a case where one micro light emitting element 100i includes two mesas will be described. However, the following descriptions are similarly applied to a case where one micro light emitting element 100i includes three mesas or more.

In addition, descriptions will be made by using a structure similar to the structure of the micro light emitting element 100h in Embodiment 9, as the structure of the micro light emitting element 100i. The structure of the micro light emitting element 100i may be similar to the structure of the micro light emitting element in the embodiments other than Embodiment 9. As illustrated in FIG. 22(b), the separation trench 15 constituting the slope 16S is formed, and at the same time, an internal separation trench 15i that divides the light emission layer 12 of one micro light emitting element into two pieces is formed.

The internal separation trench 15i is formed to be smaller than the separation trench 15. The depth of the internal separation trench 15i may be smaller than the depth of the separation trench 15. After the separation trench 15 and the internal separation trench 15i are formed, as illustrated in FIG. 22(c), the isolation trench 18 is formed. The isolation trench 18 is formed only in the bottom of the separation trench 15, and is not formed in the bottom of the internal separation trench 15i. In this manner, the outer shape of the micro light emitting element 100i is determined by the separation trench 15 and the isolation trench 18. The internal separation trench 15i divides the light emission layer 12 of one micro light emitting element 100i into two pieces.

After the isolation trench 18 is formed, as illustrated in FIG. 22(d), the transparent insulating film 17 is deposited and then the P-contact holes 19P are formed as illustrated in FIG. 22(e). Here, the P-contact hole 19P is formed for each mesa 16. Processes subsequent to the process of forming the P-contact hole 19P, including the manufacturing flow of the image display element 200i, are the same as those in the manufacturing flow of the image display element 200h in Embodiment 9. In the N connection region 3, it is not necessary that a dummy connection element 101i in the image display element 200i has a configuration of including a plurality of mesas 16. The dummy connection element 101i may have the same configuration as that of the dummy connection element 101h in Embodiment 9.

The micro light emitting element 100i including the plurality of mesas 16 is useful in the following cases of (1) and (2). (1) Used in redundant relief. P-electrodes 20P which are independent from each other are arranged in each mesa 16, and drives independently for each mesa 16. A current does not flow in one of two mesas 16, which does not show normal light emission. Since the current flows only in one normal mesa, it is possible to significantly reduce the defect rate of the micro light emitting element 100i.

(2) Increasing the light emission efficiency of the relatively large micro light emitting element 100i. As illustrated in FIG. 6(b), as the size of the slope 16S increases, the light extraction efficiency is improved. Thus, a large slope is required for the large micro light emitting element 100i. However, it is difficult to form the large slope in terms of a manufacturing technology. Thus, in accordance with the size of a slope which can be produced, the plurality of mesas 16 is formed to an extent that the light extraction efficiency is improved to the maximum, the light emission layer 12 of the micro light emitting element is divided by the plurality of mesas 16, and the light extraction efficiency in the entirety of the micro light emitting element is improved.

As described above, similar to Embodiment 1, it is also possible to improve the light extraction efficiency and to prevent the occurrence of light leakage between the micro light emitting elements 100i adjacent to each other.

Embodiment 11

(Configuration of Image Display Element 200j)

Figure 23:
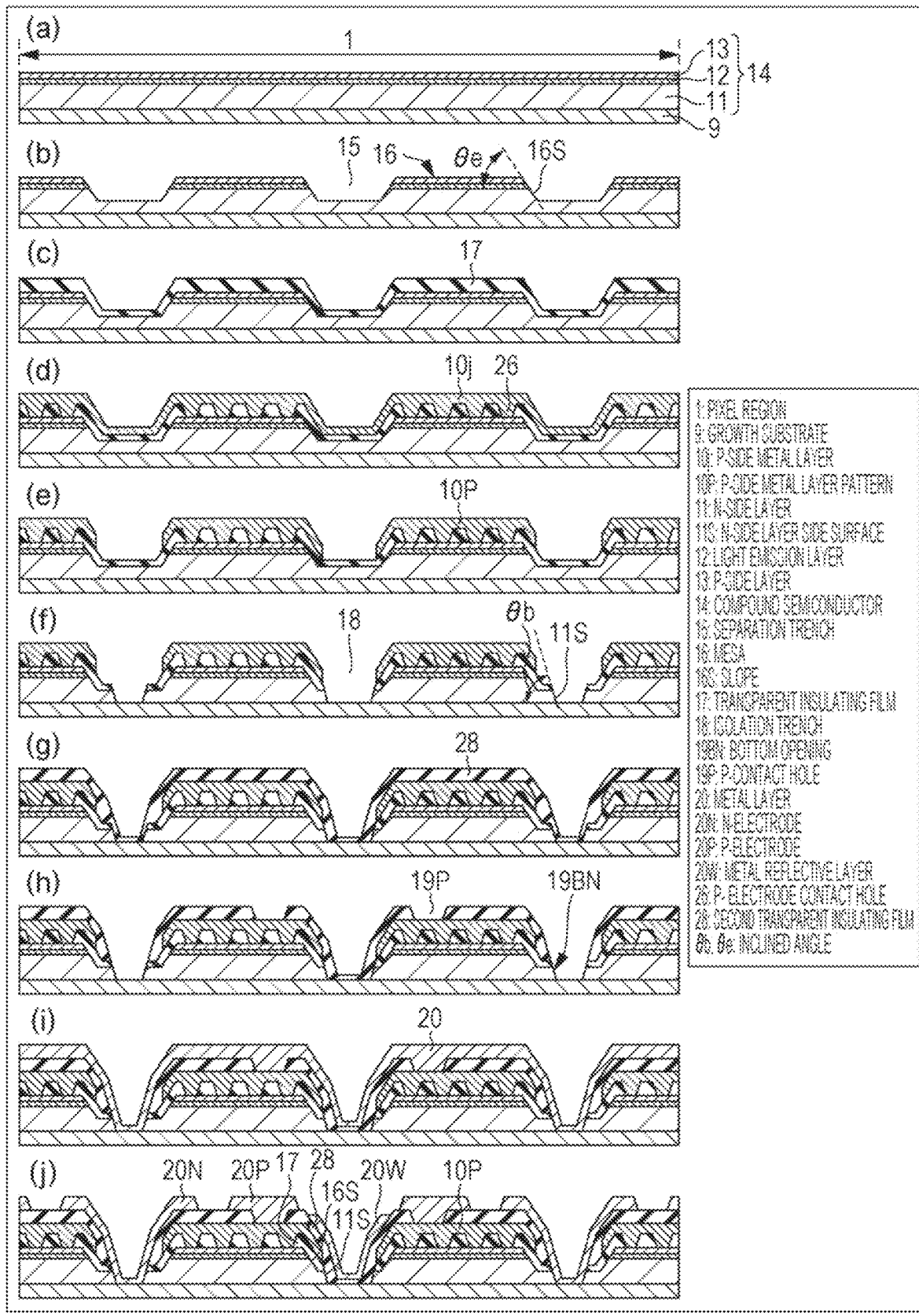
FIGS. 23(a) to 23(j) are schematic sectional views illustrating a manufacturing flow of a micro light emitting element according to Embodiment 11 of the present invention.

Still another embodiment of the present invention will be described below with reference to FIG. 23. For easy description, members having the same functions as the members described in the above embodiment are denoted by the same reference signs, and repetitive descriptions thereof will not be made. An image display element 200j in Embodiment 11 is different from those in the above embodiments in that the transparent insulating film (first transparent insulating film) 17 that covers the slope 16S and the second transparent insulating film 28 that covers the N-side layer side surface 11S are separate members. The configuration of the image display element 200j is similar to the configuration of the image display element 200c in that the metal reflective layer 20W and the N-side layer side surface 11S are connected to each other at a portion of the N-side layer side surface 11S of the micro light emitting element 100c in Embodiment 4, and the metal reflective layer 20W is also used as the N-electrode 20N.

The configuration of the image display element 200j is similar to the image display element 200e in Embodiment 6 in that the P-side transparent insulation film (third transparent insulating film) 25 is disposed between the P-side layer 13 and the P-side metal layer 10e in Embodiment 6. Thus, the image display element 200j has an additional advantage in that it is not necessary to form the common N-electrode 40 after the micro light emitting element and the driving circuit substrate are stuck to each other, and the growth substrate 9 is removed, and has an additional advantage in that the light extraction efficiency is further improved by the P-side transparent insulation film 25.

(Manufacturing Flow of Micro Light Emitting Element 100j)

FIGS. 23(a) to 23(j) are schematic sectional views illustrating the manufacturing flow of a micro light emitting element 100j according to Embodiment 11 of the present invention. The micro light emitting element 100j is included in the image display element 200j. In descriptions of the manufacturing flow of the micro light emitting element 100j, the P-side layer 13 side is set to be upper, and a growth substrate 9 side is set to be lower. As illustrated in FIG. 23(a), the compound semiconductor 14 is stacked by sequentially stacking the N-side layer 11, the light emission layer 12, and the P-side layer 13 on the growth substrate 9. The P-side metal layer as in Embodiment 1 is not deposited at this stage.

After the compound semiconductor 14 is stacked, as illustrated in FIG. 23(b), portions of the P-side layer 13, the light emission layer 12, and the N-side layer 11 are etched to form the separation trench 15. At this time, a portion including the light emission layer 12 serves as a mesa 16. The slope 16S being the side surface of the mesa 16 is inclined at the inclined angle θe, similar to other embodiments.

After the separation trench 15 is formed, as illustrated in FIG. 23(c), the transparent insulating film 17 is deposited to cover the exposed portions of the N-side layer 11, the light emission layer 12, and the P-side layer 13. Then, similar to Embodiment 6, the P-side metal layer contact hole 26 is formed at a portion of-the transparent insulating film 17 deposited on the mesa 16 and then a P-side metal layer 10j is deposited. As a result, a state as illustrated in FIG. 23(d) occurs. The transparent insulating film 17 of the micro light emitting element 100j has a function as the transparent insulating film (first transparent insulating film) that covers the slope 16S and as the P-side transparent insulation film (third transparent insulating film) 25 in Embodiment 6.

After the P-side metal layer 10j is deposited, as illustrated in FIG. 23(e), the P-side metal layer 10j is processed to a P-side metal layer pattern 10P by the photolithographic method and the dry etching method. The P-side metal layer pattern 10P covers at least the P-side layer 13 deposited on the mesa 16 and covers at least a portion of the slope 16S.

After the P-side metal layer 10j is processed to the P-side metal layer pattern 10P, as illustrated in FIG. 23(f), the isolation trench 18 is formed in the bottom of the separation trench 15. Processing of the P-side metal layer pattern 10P may be performed simultaneously with formation of the isolation trench 18. The N-side layer side surface 11S being the side surface of the isolation trench 18 is inclined at the inclined angle θb, similar to other embodiments.

After the isolation trench 18 is formed, as illustrated in FIG. 23(g), the second transparent insulating film 28 is deposited to cover exposed portions of the transparent insulating film 17, the P-side metal layer pattern 10P, the N-side layer side surface 11S, and the growth substrate 9. The material similar to that for the transparent insulating film 17 can be applied to the second transparent insulating film 28. After the second transparent insulating film 28 is deposited, as illustrated in FIG. 23(h), similar to FIG. 12(b) in Embodiment 4, the P-contact hole 19P and the bottom opening 19BN are formed in the second transparent insulating film 28.

Then, as illustrated in FIG. 23(i), the metal layer 20 is deposited to cover exposed portions of the N-side layer 11, the P-side metal layer pattern 10P, the transparent insulating film 17, and the second transparent insulating film 28. Further, as illustrated in FIG. 23(j), the metal layer 20 is processed to be the P-electrode 20P and the metal reflective layer 20W which is also used as the N-electrode 20N. The processes are similar to the processes illustrated in FIGS. 12(c) and 12(d). Similar to the processes illustrated in FIGS. 12(e) and 12(f) in Embodiment 4, in the manufacturing flow of the image display element 200j, the micro light emitting element 100j is connected to the driving circuit substrate 50c by the bonding material 70, and the growth substrate 9 is removed.

In the configuration of the image display element 200j, most of the N-side layer side surface 11S is covered by the second transparent insulating film 28, and the metal reflective layer 20W covers the outer side of the second transparent insulating film 28. A portion of the upper portion of the slope 16S is covered by the transparent insulating film 17 and the P-side metal layer pattern 10P. A portion of the lower portion of the slope 16S is covered by the transparent insulating film 17 and the second transparent insulating film 28. The outer side of the second transparent insulating film 28 is covered by the metal reflective layer 20W.

A portion of the center portion of the slope 16S is covered by the transparent insulating film 17 and the P-side metal layer pattern 10P. The outer side of the P-side metal layer pattern 10P is covered by the second transparent insulating film 28 and the metal reflective layer 20W. The P-side metal layer pattern 10P and the metal reflective layer 20W are disposed to overlap each other, and thus the occurrence of light leakage from the micro light emitting element 100j to the outside is prevented.

In the configuration of the image display element 200j, most of the N-side layer side surface 11S, the slope 16S, and most of the P-side layer 13 can be covered by the transparent insulating film 17 and the second transparent insulating film 28, and the metal reflective layer 20W as a metal film having high reflectivity can be disposed on the outside of the second transparent insulating film 28. Thus, it is possible to realize very high light extraction efficiency while the occurrence of light leakage is prevented. In the image display element 200j, as illustrated in FIG. 23(j), the second transparent insulating film 28 is disposed between the N-side layer side surface 11S and the metal reflective layer 20W.

Embodiment 12

(Configuration of Image Display Element 200k)

Figure 24:
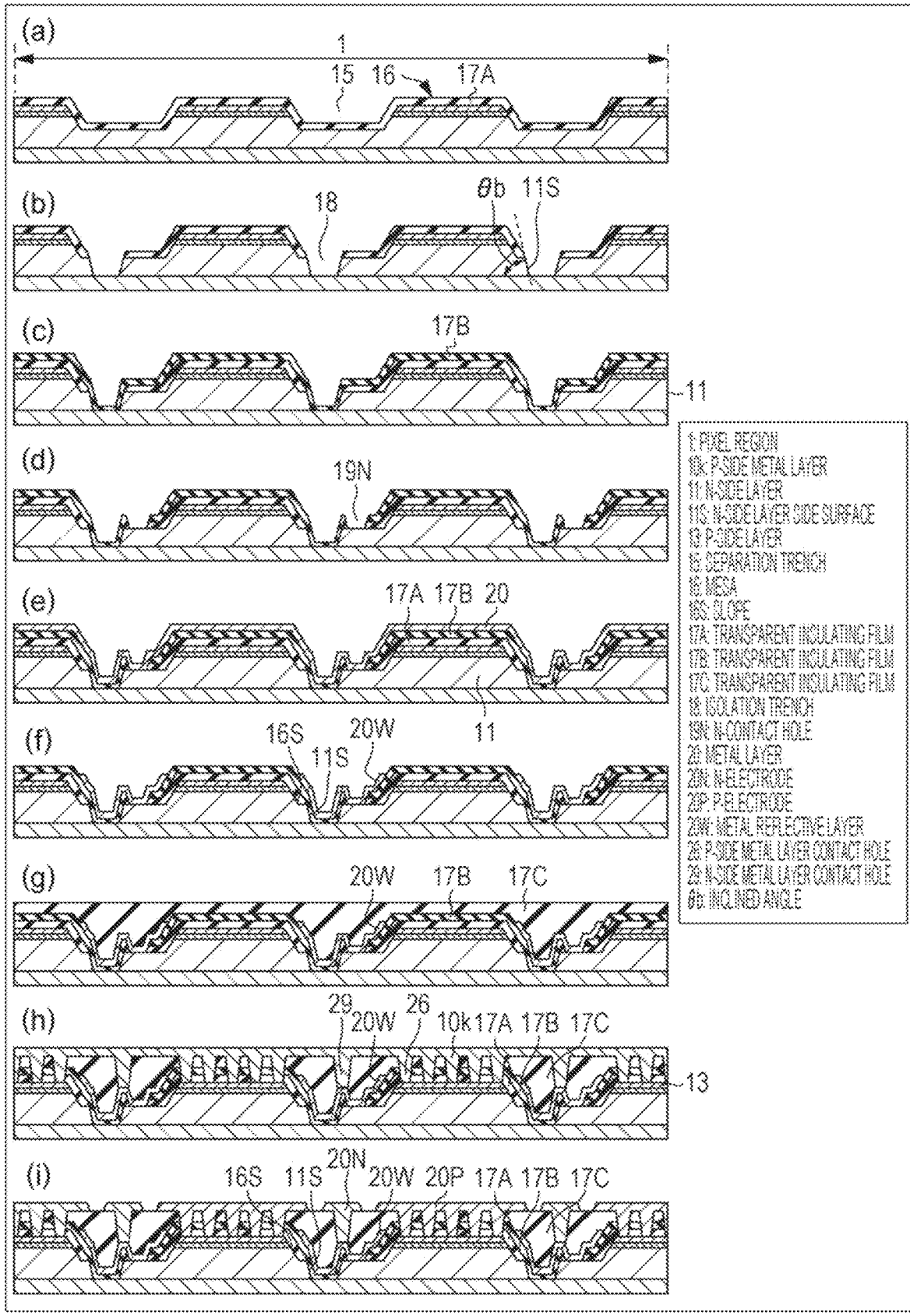
FIGS. 24(a) to 24(i) are schematic sectional views illustrating a manufacturing flow of a micro light emitting element according to Embodiment 12 of the present invention.

Still another embodiment of the present invention will be described below with reference to FIG. 24. For easy description, members having the same functions as the members described in the above embodiment are denoted by the same reference signs, and repetitive descriptions thereof will not be made. An image display element 200k in Embodiment 12 is different from the image display element 200j in Embodiment 11 in that the configuration of the transparent insulating film (first transparent insulating film) 17 that covers the slope 16S, and the P-side transparent insulation film (third transparent insulating film) 25 are different. In the image display element 200k, the connection method of the metal electrode to the N-side layer 11 is different from that in the image display element 200j, but it is possible to realize an effect similar to that in the image display element 200j.

(Manufacturing Flow of Micro Light Emitting Element 100k)

FIGS. 24(a) to 24(i) are schematic sectional views illustrating the manufacturing flow of a micro light emitting element 100k according to Embodiment 12 of the present invention. The micro light emitting element 100k is included in the image display element 200k. A state after processes similar to the processes illustrated in FIGS. 23(a) to 23(c) are performed is a state illustrated in FIG. 24(a).

A transparent insulating film formed at a stage of the process illustrated in FIG. 24(a) is set to a transparent insulating film 17A. Then, as illustrated in FIG. 24(b), the isolation trench 18 is formed in the bottom of the separation trench 15. The N-side layer side surface 11S being the side surface of the isolation trench 18 is inclined at the inclined angle θb, similar to other embodiments. Preferably, a flat portion for forming the N-contact hole 19N remains in the bottom of the separation trench 15 even after the isolation trench 18 is formed.

After the isolation trench 18 is formed, as illustrated in FIG. 24(c), a transparent insulating film 17B is deposited to cover exposed portions of the N-side layer side surface 11S, the transparent insulating film 17A, and the growth substrate 9. Further, as illustrated in FIG. 24(d), the N-contact hole 19N is formed at portions of the transparent insulating films 17A and 17B, which are deposited on the flat portion of the separation trench 15.

After the N-contact hole 19N is formed, as illustrated in FIG. 24(e), the metal layer 20 is deposited to cover exposed portions of the N-side layer 11 and the transparent insulating films 17A and 17B. After the metal layer 20 is deposited, as illustrated in FIG. 24(f), the metal layer 20 is processed and patterned to the metal reflective layer 20W by the photolithographic method and the dry etching method. The metal reflective layer 20W covers the N-side layer side surface 11S and the slope 16S. The metal reflective layer 20W is electrically connected to the N-side layer 11 in the N-contact hole 19N. The metal reflective layer 20W may cover the isolation trench 18 and the separation trench 15.

After the metal layer 20 is patterned and processed, as illustrated in FIG. 24(g), a transparent insulating film 17C is deposited to cover exposed portions of the transparent insulating film 17B and the metal reflective layer 20W, and the surface of the transparent insulating film 17C is flattened by the CMP method. After the surface of the transparent insulating film 17C is flattened, as illustrated in FIG. 24(h), the P-side metal layer contact hole 26 is formed by removing the transparent insulating films 17A, 17B, and 17C, so as to expose the P-side layer 13.

An N-side metal layer contact hole 29 is formed by removing the transparent insulating film 17C, so as to expose the metal reflective layer 20W. A P-side metal layer 10k is deposited to cover exposed portions of the P-side layer 13, the transparent insulating film 17C, and the metal reflective layer 20W. A process of depositing the P-side metal layer 10k is performed in a manner similar to the process of depositing the P-side metal layer 10e in the image display element 200e in Embodiment 6. After the P-side metal layer 10k is deposited, as illustrated in FIG. 24(i), the P-electrode 20P and the N-electrode 20N are formed by performing pattern processing on the P-side metal layer 10k.

In the configuration of the image display element 200k, as illustrated in FIG. 24(i), the transparent insulating film (second transparent insulating film) 17B covers the N-side layer side surface 11S, and a stacked film (first transparent insulating film) of the transparent insulating film 17A and the transparent insulating film 17B covers the slope 16S. In addition, a stacked film of the transparent insulating film 17A, the transparent insulating film 17B, and the transparent insulating film 17C serves as the P-side transparent insulation film (third transparent insulating film). In plan view from a side opposite to the light emitting surface side, the metal reflective layer 20W and the P-electrode 20P are disposed to overlap each other.

The damascene method can be employed for a manufacturing flow of the metal reflective layer 20W in the image display element 200k. That is, after the metal layer 20 is buried in the separation trench 15 and the isolation trench 18, the surface of the metal layer 20 is flattened by the CMP method, and the transparent insulating film 17B on the mesa 16 is exposed. Thereby, the metal reflective layer 20W can be formed. In this case, it is not necessary to flatten the surface of the transparent insulating film 17C by the CMP method. There is an advantage in that a difference between the depth of the N-side metal layer contact hole 29 and the depth of the P-side metal layer contact hole 26 is small, and it is easy to simultaneously form the N-side metal layer contact hole 29 and the P-side metal layer contact hole 26.

As described above, similar to Embodiment 1, it is also possible to improve the light extraction efficiency and to prevent the occurrence of light leakage between the micro light emitting elements 100k adjacent to each other.

CONCLUSION

According to Aspect 1 of the present invention, a micro light emitting element includes a compound semiconductor in which a first conductive layer, a light emission layer, and a second conductive layer having a conductivity type opposite to a conductivity type of the first conductive layer are stacked in order from a light emitting surface side. A first metal film electrically connected to the second conductive layer is disposed on a surface on an opposite side of the light emitting surface side. The first metal film covers the second conductive layer. A slope is formed around the light emission layer. A first inclined angle of a first conductive layer side surface from the slope to the light emitting surface is larger than a second inclined angle of the slope. The slope and the first conductive layer side surface are covered together by a second metal film. A first transparent insulating film is disposed between the slope and the second metal film.

According to Aspect 2 of the present invention, in Aspect 1, a second transparent insulating film may be disposed between the first conductive layer side surface and the second metal film.

According to Aspect 3 of the present invention, in Aspect 2, the second transparent insulating film may be obtained by the first transparent insulating film extending between the first conductive layer side surface and the second metal film.

According to Aspect 4 of the present invention, a micro light emitting element includes a compound semiconductor in which a first conductive layer, a light emission layer, and a second conductive layer having a conductivity type opposite to a conductivity type of the first conductive layer are stacked in order from a light emitting surface side. A first metal film electrically connected to the second conductive layer is disposed on a surface on an opposite side of the light emitting surface side. The first metal film covers the second conductive layer. A slope is formed around the light emission layer. The slope extends to the light emitting surface and is covered by a second metal film. A first transparent insulating film is disposed between the slope and the second metal film.

According to Aspect 5 of the present invention, in Aspect 1, a third transparent insulating film may be disposed between the second conductive layer and the first metal film.

According to Aspect 6 of the present invention, in Aspect 1, in plan view from an opposite side of the light emitting surface side, the second metal film may be disposed to overlap the first metal film.

According to Aspect 7 of the present invention, in Aspect 1, the film thickness of the transparent insulating film may be equal to or more than 75 nm.

According to Aspect 8 of the present invention, in Aspect 7, the film thickness of the transparent insulating film may be equal to or more than 400 nm.

According to Aspect 9 of the present invention, in Aspect 1, the second inclined angle may be equal to or less than 60°.

According to Aspect 10 of the present invention, in Aspect 9, the second inclined angle may be equal to or less than 50°.

According to Aspect 11 of the present invention, in Aspect 1, the first metal film may include a layer containing silver or aluminum as a main component, on the compound semiconductor side.

According to Aspect 12 of the present invention, in Aspect 1, the second metal film may include a layer containing silver or aluminum as a main component, on the compound semiconductor side.

According to Aspect 13 of the present invention, in Aspect 1, the transparent insulating film may be a $SiO_2$ film.

According to Aspect 14 of the present invention, in Aspect 1, the first inclined angle may be less than 90°.

According to Aspect 15 of the present invention, in Aspect 1, the second metal film may be electrically connected to the first conductive layer.

According to Aspect 16 of the present invention, in Aspect 15, the micro light emitting element may further include a second electrode electrically connected to the second metal film, on an opposite side of the light emitting surface side.

According to Aspect 17 of the present invention, in Aspect 1, the micro light emitting element may further include a light emitting surface-side electrode configured from a transparent conductive film electrically connected to the first conductive layer, on a surface of the first conductive layer on the light emitting surface side.

According to Aspect 18 of the present invention, an image display element may have a pixel region in which micro light emitting elements in any of Aspects 1 to 17 are arranged on a driving circuit substrate in a two-dimensional array shape. A surface of the micro light emitting element on an opposite side of the light emitting surface side may face a surface of the driving circuit substrate. First driving electrodes for supplying a current to the micro light emitting elements may be arranged in a two-dimensional array shape on a surface of the driving circuit substrate in the pixel region. A first electrode and the first driving electrode may be connected in a one-to-one relation, and the first electrode may be disposed on a surface on an opposite side of the light emitting surface side and be electrically connected to the first metal film.

According to Aspect 19 of the present invention, an image display element may have a pixel region in which micro light emitting elements in Aspect 17 are arranged on a driving circuit substrate in a two-dimensional array shape. A surface of the micro light emitting element on an opposite side of the light emitting surface side may face a surface of the driving circuit substrate. First driving electrodes for supplying a current to the micro light emitting elements may be arranged in a two-dimensional array shape on a surface of the driving circuit substrate in the pixel region. A first electrode and the first driving electrode may be connected in a one-to-one relation, and the first electrode may be disposed on a surface on an opposite side of the light emitting surface side and be electrically connected to the first metal film. A second driving electrode may be disposed on a surface of the driving circuit substrate on an outside of the pixel region. The second driving electrode may be electrically connected to the light emitting surface-side electrode.

According to Aspect 20 of the present invention, an image display element may have a pixel region in which micro light emitting elements in Aspect 16 are arranged on a driving circuit substrate in a two-dimensional array shape. A surface of the micro light emitting element on an opposite side of the light emitting surface side may face a surface of the driving circuit substrate. First driving electrodes and second driving electrodes for supplying a current to the micro light emitting elements may be arranged in a two-dimensional array shape on a surface of the driving circuit substrate in the pixel region. A first electrode and the first driving electrode may be connected in a one-to-one relation, and the first electrode may be disposed on a surface on an opposite side of the light emitting surface side and be electrically connected to the first metal film. The second electrode and the second driving electrode may be connected to each other.

The present invention is not limited to the above-described embodiments, and various modifications can be made within the scope of the claims. Embodiments obtained by appropriately combining the technical means disclosed in the different embodiments are included in the technical scope of the present invention. Further, a new technical feature can be formed by combining the technical means disclosed in the embodiments.

REFERENCE SIGNS LIST 100, 100a, 100b, 100c, 100d, 100g, 100h, 100i, 100j, 100k MICRO LIGHT EMITTING ELEMENT
1 PIXEL REGION
10, 10e, 10f, 10j, 10k P-SIDE METAL LAYER (FIRST METAL FILM)
11 N-SIDE LAYER (FIRST CONDUCTIVE LAYER)
11S N-SIDE LAYER SIDE SURFACE (FIRST CONDUCTIVE LAYER SIDE SURFACE)
12 LIGHT EMISSION LAYER
13 P-SIDE LAYER (SECOND CONDUCTIVE LAYER)
14 COMPOUND SEMICONDUCTOR
16S SLOPE
17 TRANSPARENT INSULATING FILM
20N N-ELECTRODE (SECOND ELECTRODE)
20P P-ELECTRODE (FIRST ELECTRODE)
20W METAL REFLECTIVE LAYER
25, 25f P-SIDE TRANSPARENT INSULATION FILM
28 SECOND TRANSPARENT INSULATING FILM
40 COMMON N-ELECTRODE (LIGHT EMITTING SURFACE-SIDE ELECTRODE)
50, 50c, 50d DRIVING CIRCUIT SUBSTRATE
51 P-DRIVE ELECTRODE (FIRST DRIVING ELECTRODE)
52 N-DRIVE ELECTRODE (SECOND DRIVING ELECTRODE)
200, 200a, 200b, 200c, 200d, 200e, 200f, 200g, 200h, 200i, 200j, 200k IMAGE DISPLAY ELEMENT
θb INCLINED ANGLE (FIRST INCLINED ANGLE)
θe INCLINED ANGLE (SECOND INCLINED ANGLE)

The invention claimed is:

1. An image display element having a pixel region in which micro light emitting elements are arranged on a driving circuit substrate in a two-dimensional array shape, and an upper surface of each of the micro light emitting elements is a light emitting surface, and a lower surface of each of the micro light emitting elements is a surface on an opposite side of the upper surface of each of the micro light emitting elements, and the lower surface of each of the micro light emitting elements faces a surface of the driving circuit substrate,
   wherein the micro light emitting element comprising:
   a compound semiconductor in which a first conductive layer, a light emission layer, and a second conductive layer having a conductivity type opposite to a conductivity type of the first conductive layer are stacked in order from an upper side to a lower side;
   wherein the compound semiconductor has a slope formed around the light emission layer and having a second inclined angle and has a first conductive layer side surface extending from the slope to an upper surface of the compound semiconductor and having a first inclined angle; and
   wherein the first inclined angle is larger than the second inclined angle, and the first inclined angle is less than 90° ; and
   a second metal film which covers both the slope and the first conductive layer side surface; and
   a first transparent insulating film which is disposed between the slope and the second metal film, wherein the upper surface of the compound semiconductor and an upper surface of the second metal film are in a same plane.

2. The image display element according to claim 1, wherein a second transparent insulating film is disposed between the first conductive layer side surface and the second metal film of the micro light emitting element.

3. The image display element according to claim 2, wherein the second transparent insulating film is an extension of the first transparent insulating film to the first conductive layer side surface.

4. The image display element according to claim 2, wherein the second metal film is disposed on the lower surface of each of the micro light emitting elements.

5. The image display element according to claim 4, wherein the second metal film is electrically connected to the second conductive layer.

6. The image display element according to claim 4, wherein, in plan view from a side of the lower surface of each of the micro light emitting elements, the second metal film covers the compound semiconductor entirely.

7. The image display element according to claim 5, wherein the second metal film comprises a first electrode of the micro light emitting element.

8. The image display element according to claim 1, wherein a first metal film is disposed on a lower surface of the compound semiconductor and the first metal film is spaced apart from the second metal film, and the first metal film covers the second conductive layer,
wherein the first metal film is electrically connected to the second conductive layer.

9. The image display element according to claim 8, wherein the second metal film is electrically connected to the first conductive layer.

10. The image display element according to claim 8, wherein a third transparent insulating film is disposed between the second conductive layer and the first metal film.

11. The image display element according to claim 8, wherein, in plan view from a side of the lower surface of each of the micro light emitting elements, the second metal film is disposed to overlap the first metal film.

12. The image display element according to claim 9, wherein the second metal film comprises a second electrode of the micro light emitting element.

13. The image display element according to claim 1, wherein a film thickness of the first transparent insulating film is equal to or more than 75 nm.

14. The image display element according to claim 13, wherein the film thickness of the first transparent insulating film is equal to or more than 400 nm.

* * * * *